United States Patent
Qiu et al.

(10) Patent No.: US 7,660,058 B2
(45) Date of Patent: Feb. 9, 2010

(54) METHODS FOR ETCHING LAYERS WITHIN A MEMS DEVICE TO ACHIEVE A TAPERED EDGE

(75) Inventors: Chengbin Qiu, Cupertino, CA (US); Teruo Sasagawa, Los Gatos, CA (US); Ming-Hau Tung, San Francisco, CA (US); Chun-Ming Wang, Fremont, CA (US); Stephen Zee, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 525 days.

(21) Appl. No.: 11/506,770

(22) Filed: Aug. 18, 2006

(65) Prior Publication Data
US 2008/0218840 A1    Sep. 11, 2008

Related U.S. Application Data

(60) Provisional application No. 60/710,019, filed on Aug. 19, 2005.

(51) Int. Cl.
*H01L 21/302* (2006.01)
*B44C 1/22* (2006.01)

(52) U.S. Cl. ............ 359/900; 438/737; 438/738; 216/52

(58) Field of Classification Search ......... 359/290–292, 359/900; 438/706, 713, 734, 737, 738, 742; 216/24, 41, 52; 427/162, 534
See application file for complete search history.

(56) References Cited

U.S. PATENT DOCUMENTS

| | | | |
|---|---|---|---|
| 3,656,836 A | 4/1972 | de Cremoux et al. | |
| 4,377,324 A | 3/1983 | Durand et al. | |
| 4,403,248 A | 9/1983 | te Velde | |
| 4,459,182 A | 7/1984 | te Velde | |
| 4,482,213 A | 11/1984 | Piliavin et al. | |
| 4,863,245 A | 9/1989 | Roxlo | |

(Continued)

FOREIGN PATENT DOCUMENTS

CH    680534    9/1992

(Continued)

OTHER PUBLICATIONS

ISR and WO for PCT/US2006/032516 filed Aug. 17, 2006.

(Continued)

*Primary Examiner*—Jack Dinh
(74) *Attorney, Agent, or Firm*—Knobbe Martens Olson & Bear LLP

(57) ABSTRACT

Certain MEMS devices include layers patterned to have tapered edges. One method for forming layers having tapered edges includes the use of an etch leading layer. Another method for forming layers having tapered edges includes the deposition of a layer in which the upper portion is etchable at a faster rate than the lower portion. Another method for forming layers having tapered edges includes the use of multiple iterative etches. Another method for forming layers having tapered edges includes the use of a liftoff mask layer having an aperture including a negative angle, such that a layer can be deposited over the liftoff mask layer and the mask layer removed, leaving a structure having tapered edges.

19 Claims, 21 Drawing Sheets

U.S. PATENT DOCUMENTS

| | | |
|---|---|---|
| 4,965,562 A | 10/1990 | Verhulst |
| 5,061,049 A | 10/1991 | Hornbeck |
| 5,078,479 A | 1/1992 | Vuilleumier |
| 5,099,353 A | 3/1992 | Hornbeck |
| 5,142,405 A | 8/1992 | Hornbeck |
| 5,192,946 A | 3/1993 | Thompson et al. |
| 5,218,472 A | 6/1993 | Jozefowicz et al. |
| 5,226,099 A | 7/1993 | Mignardi et al. |
| 5,293,272 A | 3/1994 | Jannson et al. |
| 5,312,512 A | 5/1994 | Allman et al. |
| 5,381,232 A | 1/1995 | van Wijk |
| 5,474,865 A | 12/1995 | Vasudev |
| 5,488,505 A | 1/1996 | Engle |
| 5,526,688 A | 6/1996 | Boysel et al. |
| 5,578,976 A | 11/1996 | Yao |
| 5,597,736 A | 1/1997 | Sampsell |
| 5,600,383 A | 2/1997 | Hornbeck |
| 5,602,671 A | 2/1997 | Hornbeck |
| 5,646,768 A | 7/1997 | Kaeriyama |
| 5,665,997 A | 9/1997 | Weaver et al. |
| 5,674,757 A | 10/1997 | Kim |
| 5,737,050 A | 4/1998 | Takahara et al. |
| 5,771,321 A | 6/1998 | Stern |
| 5,784,189 A | 7/1998 | Bozler et al. |
| 5,818,095 A | 10/1998 | Sampsell |
| 5,822,170 A | 10/1998 | Cabuz et al. |
| 5,824,608 A | 10/1998 | Gotoh et al. |
| 5,835,256 A | 11/1998 | Huibers |
| 5,943,155 A | 8/1999 | Goossen |
| 5,945,980 A | 8/1999 | Moissev et al. |
| 5,959,763 A | 9/1999 | Bozler et al. |
| 5,967,163 A | 10/1999 | Pan et al. |
| 5,976,902 A | 11/1999 | Shih |
| 5,994,174 A | 11/1999 | Carey et al. |
| 6,031,653 A | 2/2000 | Wang |
| 6,040,937 A | 3/2000 | Miles |
| 6,088,162 A | 7/2000 | Someno |
| 6,097,145 A | 8/2000 | Kastalsky et al. |
| 6,099,132 A | 8/2000 | Kaeriyama |
| 6,137,150 A | 10/2000 | Takeuchi et al. |
| 6,160,833 A | 12/2000 | Floyd et al. |
| 6,171,945 B1 | 1/2001 | Mandal et al. |
| 6,194,323 B1 | 2/2001 | Downey et al. |
| 6,201,633 B1 | 3/2001 | Peeters et al. |
| 6,249,039 B1 | 6/2001 | Harvey et al. |
| 6,275,220 B1 | 8/2001 | Nitta |
| 6,282,010 B1 | 8/2001 | Sulzbach et al. |
| 6,288,824 B1 | 9/2001 | Kastalsky et al. |
| 6,323,982 B1 | 11/2001 | Hornbeck |
| 6,327,071 B1 | 12/2001 | Kimura |
| 6,333,556 B1 | 12/2001 | Juengling et al. |
| 6,340,435 B1 | 1/2002 | Bjorkman et al. |
| 6,376,787 B1 | 4/2002 | Martin et al. |
| 6,391,675 B1 | 5/2002 | Ehmke et al. |
| 6,392,781 B1 | 5/2002 | Kim et al. |
| 6,424,094 B1 | 7/2002 | Feldman |
| 6,449,084 B1 | 9/2002 | Guo |
| 6,452,124 B1 | 9/2002 | York et al. |
| 6,452,465 B1 | 9/2002 | Brown et al. |
| 6,466,354 B1 | 10/2002 | Gudeman |
| 6,513,911 B1 | 2/2003 | Ozaki et al. |
| 6,549,195 B2 | 4/2003 | Hikida et al. |
| 6,552,840 B2 | 4/2003 | Knipe |
| 6,574,033 B1 | 6/2003 | Chui et al. |
| 6,600,201 B2 | 7/2003 | Hartwell et al. |
| 6,608,268 B1 | 8/2003 | Goldsmith |
| 6,624,944 B1 | 9/2003 | Wallace et al. |
| 6,639,724 B2 | 10/2003 | Bower et al. |
| 6,650,455 B2 | 11/2003 | Miles |
| 6,653,997 B2 | 11/2003 | Van Gorkom et al. |
| 6,660,656 B2 | 12/2003 | Cheung et al. |
| 6,674,562 B1 | 1/2004 | Miles |
| 6,720,267 B1 | 4/2004 | Chen et al. |
| 6,741,377 B2 | 5/2004 | Miles |
| 6,747,785 B2 | 6/2004 | Chen et al. |
| 6,747,800 B1 | 6/2004 | Lin |
| 6,791,441 B2 | 9/2004 | Pillans et al. |
| 6,794,119 B2 | 9/2004 | Miles |
| 6,803,534 B1 | 10/2004 | Chen et al. |
| 6,809,788 B2 | 10/2004 | Yamada et al. |
| 6,819,469 B1 | 11/2004 | Koba |
| 6,844,959 B2 | 1/2005 | Huibers et al. |
| 6,855,610 B2 | 2/2005 | Tung et al. |
| 6,858,080 B2 | 2/2005 | Linares et al. |
| 6,859,301 B1 | 2/2005 | Islam et al. |
| 6,906,847 B2 | 6/2005 | Huibers et al. |
| 6,912,022 B2 | 6/2005 | Lin et al. |
| 6,940,631 B2 | 9/2005 | Ishikawa |
| 6,947,200 B2 | 9/2005 | Huibers |
| 6,952,303 B2 | 10/2005 | Lin et al. |
| 6,958,847 B2 | 10/2005 | Lin |
| 6,980,350 B2 | 12/2005 | Hung et al. |
| 6,995,890 B2 | 2/2006 | Lin |
| 6,999,225 B2 | 2/2006 | Lin |
| 6,999,236 B2 | 2/2006 | Lin |
| 7,016,099 B2 | 3/2006 | Ikeda et al. |
| 7,078,293 B2 | 7/2006 | Lin et al. |
| 7,110,158 B2 | 9/2006 | Miles |
| 7,123,216 B1 | 10/2006 | Miles |
| 7,161,730 B2 | 1/2007 | Floyd |
| 7,172,915 B2 | 2/2007 | Lin et al. |
| 7,250,315 B2 | 7/2007 | Miles |
| 7,291,921 B2 | 11/2007 | Lin |
| 7,297,471 B1 | 11/2007 | Miles |
| 2001/0010953 A1 | 8/2001 | Kang et al. |
| 2001/0055208 A1 | 12/2001 | Kimura |
| 2002/0036304 A1 | 3/2002 | Ehmke et al. |
| 2002/0058422 A1 | 5/2002 | Jang et al. |
| 2002/0070931 A1 | 6/2002 | Ishikawa |
| 2002/0109899 A1 | 8/2002 | Ohtaka et al. |
| 2002/0131682 A1 | 9/2002 | Nasiri et al. |
| 2002/0149850 A1 | 10/2002 | Heffner et al. |
| 2002/0167072 A1 | 11/2002 | Andosca |
| 2002/0171610 A1 | 11/2002 | Siwinski et al. |
| 2002/0186209 A1 | 12/2002 | Cok |
| 2002/0195681 A1 | 12/2002 | Melendez et al. |
| 2003/0007107 A1 | 1/2003 | Chae |
| 2003/0021004 A1 | 1/2003 | Cunningham et al. |
| 2003/0036215 A1 | 2/2003 | Reid |
| 2003/0053078 A1 | 3/2003 | Missey et al. |
| 2003/0077843 A1 | 4/2003 | Yamauchi et al. |
| 2003/0102771 A1 | 6/2003 | Akiba et al. |
| 2003/0118920 A1 | 6/2003 | Johnstone et al. |
| 2003/0119221 A1 | 6/2003 | Cunningham et al. |
| 2003/0132822 A1 | 7/2003 | Ko et al. |
| 2003/0164350 A1 | 9/2003 | Hanson et al. |
| 2004/0051929 A1 | 3/2004 | Sampsell et al. |
| 2004/0058532 A1 | 3/2004 | Miles et al. |
| 2004/0061543 A1 | 4/2004 | Nam et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0124073 A1 | 7/2004 | Pillans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Tayebati |
| 2004/0150869 A1 | 8/2004 | Kasai |
| 2004/0150939 A1 | 8/2004 | Huff |
| 2004/0175577 A1 | 9/2004 | Lin et al. |
| 2004/0191937 A1 | 9/2004 | Patel et al. |
| 2004/0207497 A1 | 10/2004 | Hsu et al. |
| 2004/0217919 A1 | 11/2004 | Pichl et al. |
| 2005/0012577 A1 | 1/2005 | Pillans et al. |

| | | | |
|---|---|---|---|
| 2005/0012975 A1 | 1/2005 | George et al. | |
| 2005/0024557 A1 | 2/2005 | Lin | |
| 2005/0035699 A1 | 2/2005 | Tsai | |
| 2005/0046919 A1 | 3/2005 | Taguchi et al. | |
| 2005/0046922 A1 | 3/2005 | Lin et al. | |
| 2005/0078348 A1 | 4/2005 | Lin | |
| 2005/0128565 A1 | 6/2005 | Ljungblad | |
| 2005/0194867 A1 | 9/2005 | Kawakubo et al. | |
| 2005/0249966 A1 | 11/2005 | Tung et al. | |
| 2005/0250235 A1 | 11/2005 | Miles et al. | |
| 2005/0253820 A1 | 11/2005 | Horiuchi | |
| 2006/0024880 A1 | 2/2006 | Chui et al. | |
| 2006/0050393 A1 | 3/2006 | Lin et al. | |
| 2006/0056001 A1 | 3/2006 | Taguchi et al. | |
| 2006/0066511 A1 | 3/2006 | Chui | |
| 2006/0066935 A1 | 3/2006 | Cummings et al. | |
| 2006/0067646 A1 | 3/2006 | Chui | |
| 2006/0077528 A1 | 4/2006 | Floyd | |
| 2006/0209386 A1 | 9/2006 | Sudak et al. | |
| 2006/0261330 A1 | 11/2006 | Miles | |
| 2007/0121205 A1 | 5/2007 | Miles | |
| 2008/0093688 A1 | 4/2008 | Cummings et al. | |
| 2008/0144163 A1 | 6/2008 | Floyd | |

FOREIGN PATENT DOCUMENTS

| | | |
|---|---|---|
| EP | 0 667 548 | 8/1995 |
| EP | 1 170 618 | 1/2002 |
| EP | 1 243 550 | 9/2002 |
| EP | 1 452 481 | 9/2004 |
| JP | 06-281956 | 10/1994 |
| JP | 07-45550 | 2/1995 |
| JP | 09-036387 | 2/1997 |
| JP | 10-116996 | 5/1998 |
| JP | 11-243214 | 9/1999 |
| JP | 11-263012 | 9/1999 |
| JP | 2000-40831 | 2/2000 |
| JP | 2002-296521 | 10/2002 |
| JP | 2002-341267 | 11/2002 |
| JP | 2003-057571 | 2/2003 |
| JP | 2003195201 | 7/2003 |
| JP | 2005-051007 | 2/2005 |
| KR | 2002-9270 | 10/1999 |
| TW | 157313 | 5/1991 |
| WO | WO 97/17628 | 5/1997 |
| WO | WO 99/34484 | 7/1999 |
| WO | WO 03/046508 | 6/2003 |
| WO | WO 2004/000717 | 12/2003 |
| WO | WO 2004/015741 | 2/2004 |
| WO | WO 2005/066596 | 7/2005 |
| WO | WO 2005/124869 | 12/2005 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K. et al. "Surface Micromachined Tuneable Interferometer Array," Sensors and Actuators A, Elsevier Sequoia S.A., Lausanne, CH, vol. A43, No. 1/3, May 1, 1994, pp. 17-23.

Chu, et al, "Formation and Microstructures of Anodic Aluminoa Films from Aluminum Sputtered onglass Substrate" Journal of the Electrochemical Society, 149 (7) B321-8327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminium" Nature vo 337 Jan. 12, 1989, pp. 147-149.

Goossen et al., "Possible Display Applications of the Silicon Mechanical Anti-Reflection Switch," Society for Information Display (1994).

Kawamura et al., Fabrication of fine metal microstructures packaged in the bonded glass substrates, Proceedings of SPIE, vol. 3893, pp. 486-493, 1999.

Kim et al., "Control of Optical Transmission Through Metals Perforated With Subwavelength Hole Arrays," Optic Letters, vol. 24, No. 4, pp. 256-258 (Feb. 1999).

Xactix Xetch X# Specifications, http:—www.xactix.com-Xtech_X3specs.htm, Jan. 5, 2005.

Xactix Xetch Product Information.

Office Action dated Jan. 23, 2009 in U.S. Appl. No. 11/506,594.

Office Action dated Jul. 28, 2008 in U.S. Appl. No. 11/506,594.

Hall, Integrated optical inteferometric detection method for micromachined capacitiive acoustic transducers, App. Phy. Let. 80:20(3859-3961) May 20, 2002.

Matsumoto et al., Novel prevention method of stiction using silicon anodization for SOI structure, Sensors and Actuators, 72:2(153-159) Jan. 19, 1999.

Watanabe et al., Reduction of microtrenching and island formation in oxide plasma etching by employing electron beam charge neutralization, Applied Physics Letters, 79:17(2698-2700), Oct. 22, 2001.

IPRP for PCT/US2006/032516 filed Aug. 17, 2006.

ISR and WO for PCT/US2006/032691 filed Aug. 17, 2006.

IPRP for PCT/US2006/032691 filed Aug. 17, 2006.

ISR and WO for PCT/US2006/032511 filed Aug. 17, 2006.

IPRP for PCT/US2006/032511 filed Aug. 17, 2006.

| | Column Output Signals | |
|---|---|---|
| | $+V_{bias}$ | $-V_{bias}$ |
| Row Output Signals   0 | Stable | Stable |
| $+\Delta V$ | Relax | Actuate |
| $-\Delta V$ | Actuate | Relax |

METHODS FOR ETCHING LAYERS WITHIN A MEMS DEVICE TO ACHIEVE A TAPERED EDGE

CROSS-REFERENCE TO RELATED APPLICATIONS

This application claims priority under 35 U.S.C. §119(e) to U.S. Provisional Application Ser. No. 60/710,019, filed Aug. 19, 2005, which is hereby incorporated by reference in its entirety.

BACKGROUND OF THE INVENTION

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one embodiment, a method of fabricating a MEMS device is provided, the method including forming an electrode layer, forming a mask over the electrode layer, patterning the electrode layer using the mask to form an isolated electrode member, and tapering the electrode member to form an outwardly tapering edge portion, where at least a portion of the mask remains in place during the tapering.

In another embodiment, a method of fabricating a MEMS device is provided, the method including forming a sacrificial layer over a substrate, patterning the sacrificial layer to form apertures, forming a support layer over the patterned sacrificial layer, forming a mask over the support layer, patterning the support layer using the mask to form at least one support structure located at least partially within the aperture in the sacrificial layer, and tapering the support structure to form a tapered edge, where at least a portion of the mask remains in place during the tapering.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In the fabrication of MEMS devices which comprise a series of sequentially deposited layers, it is often advantageous to provide tapered or angled structures, such as an underlying layer or structure having a tapered edge in order to facilitate the conformal deposition of overlying layers without breaks or weak thinner portions. In certain embodiments, etching methods can be used to provide such tapered edges to, e.g., mirror/electrodes or support structures. In particular embodiments, these etching methods may include the use of etch leading layers overlying the layers to be etched. In other particular embodiments, these etching methods may include an iterative etching and/or ashing process. In other embodiments, liftoff processes can be used to form structures having tapered edges.

Figure 1:
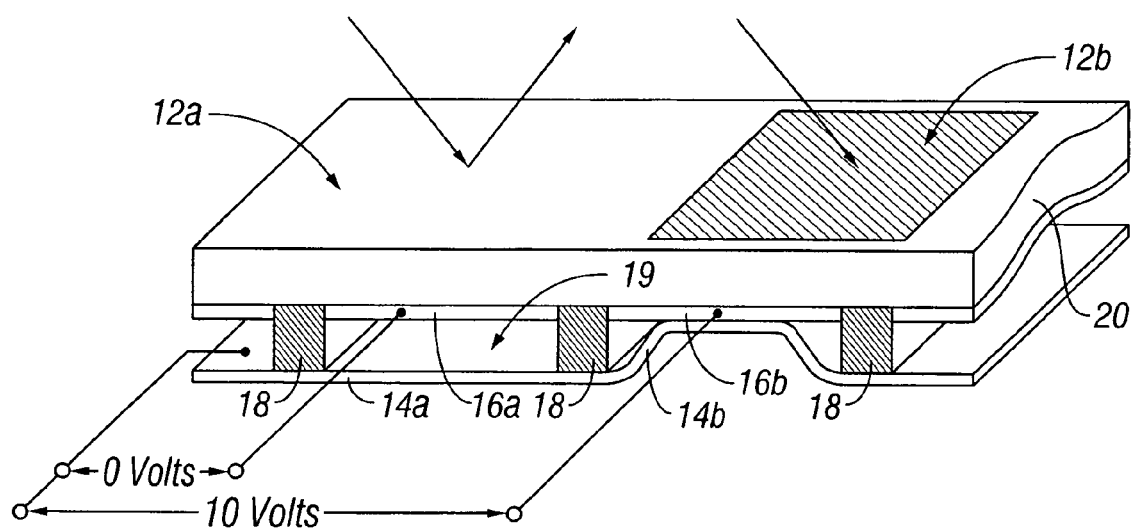
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
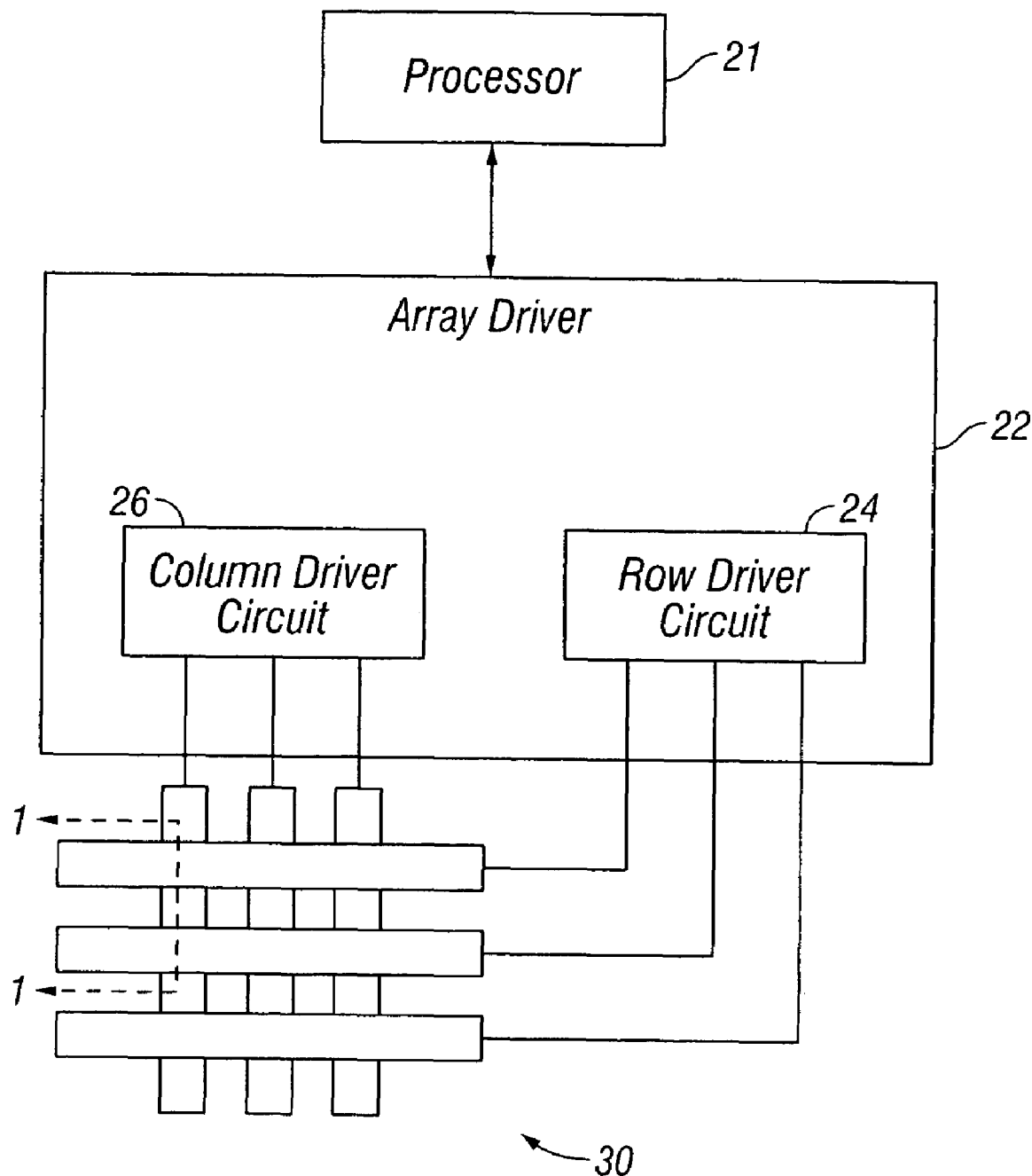
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
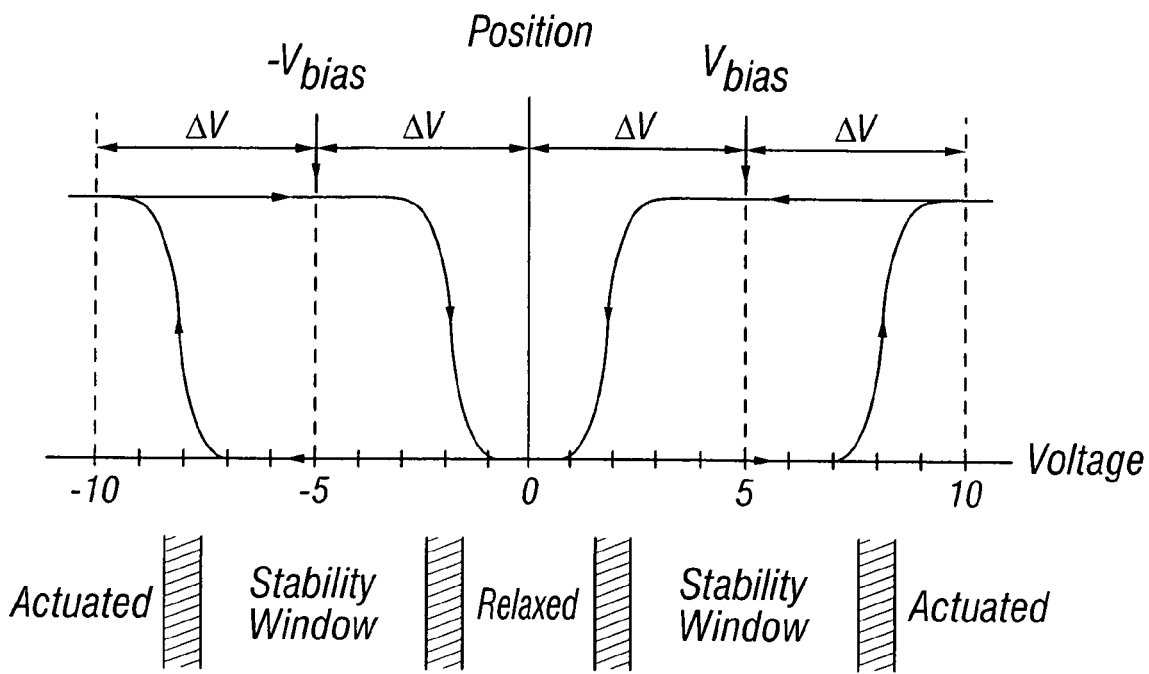
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
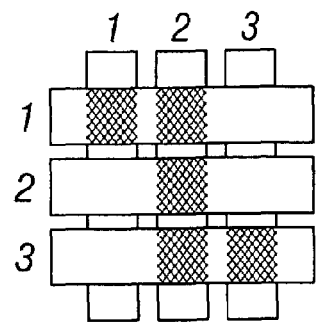
FIG. 5A illustrates one exemplary frame of display data in the 3×3 interferometric modulator display of FIG. 2.
Figure 5B:
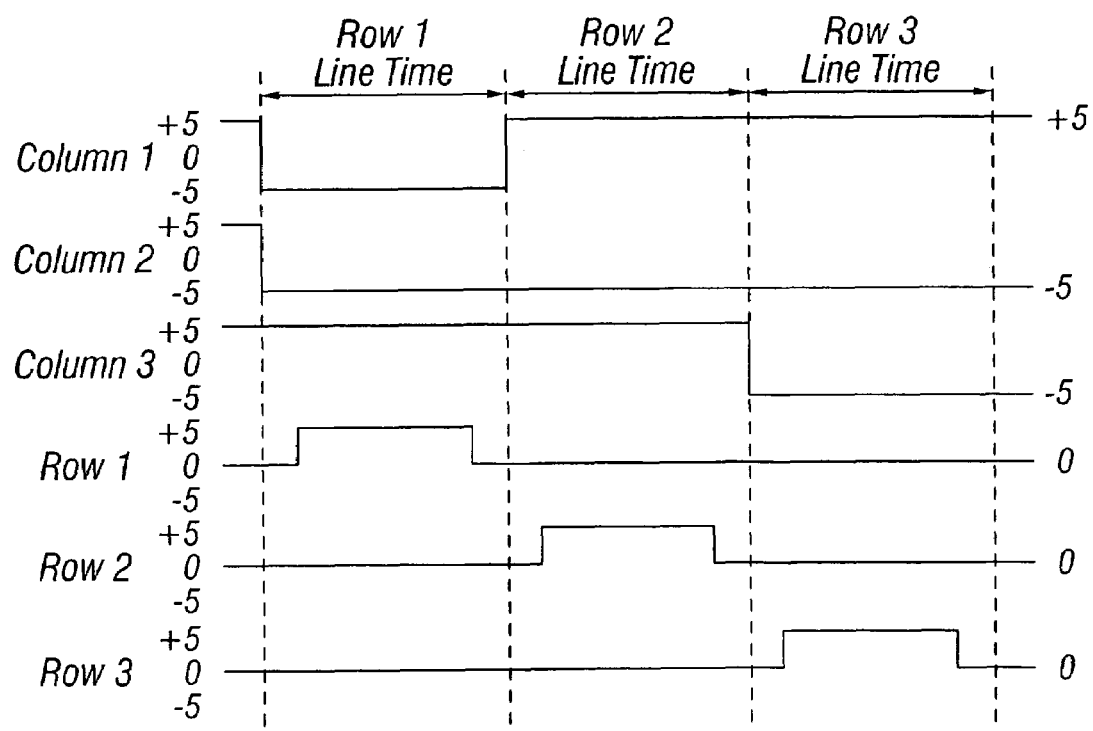
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
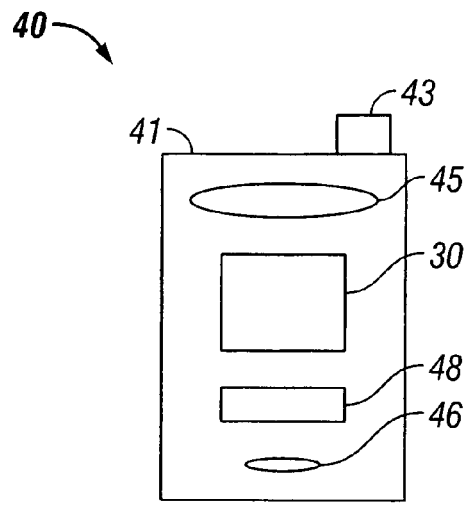
FIGS. 6A and 6B are system block diagrams illustrating an embodiment of a visual display device comprising a plurality of interferometric modulators.
Figure 6B:
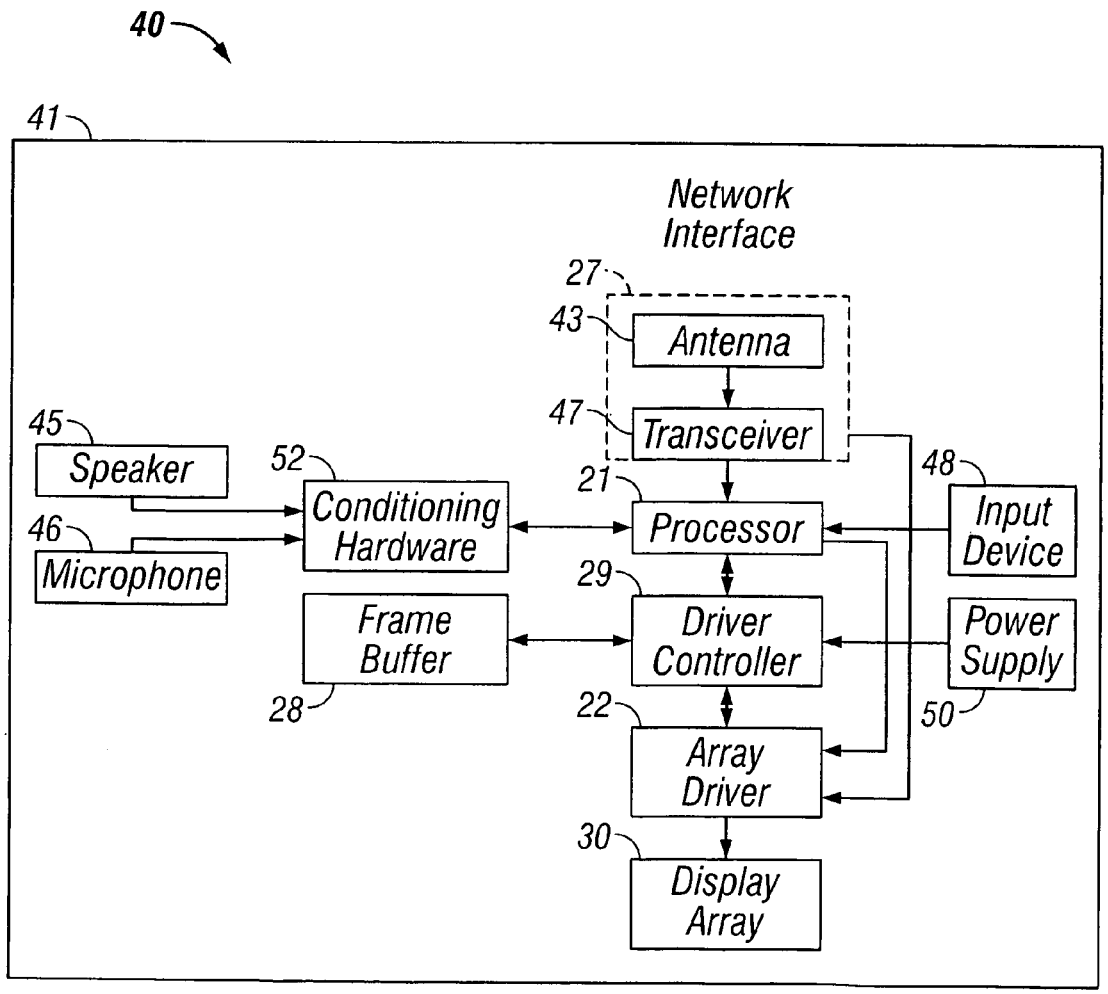

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11 (a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 preprocesses the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, the array driver 22, and the display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
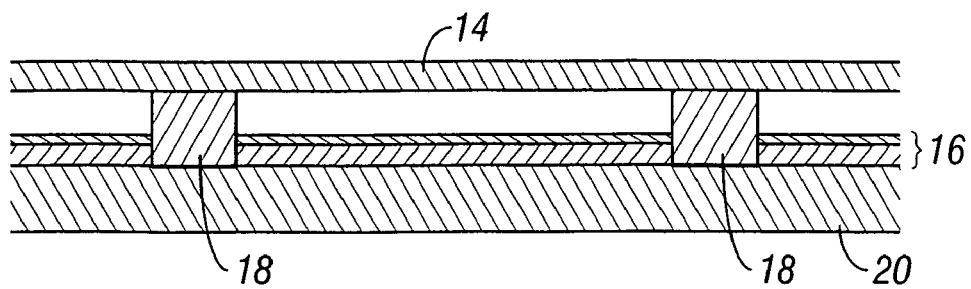
FIG. 7A is a cross section of the device of FIG. 1.
Figure 7B:
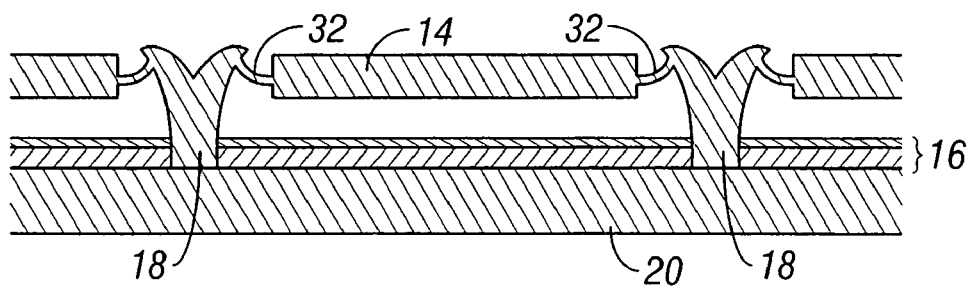
FIG. 7B is a cross section of an alternative embodiment of an interferometric modulator.
Figure 7C:
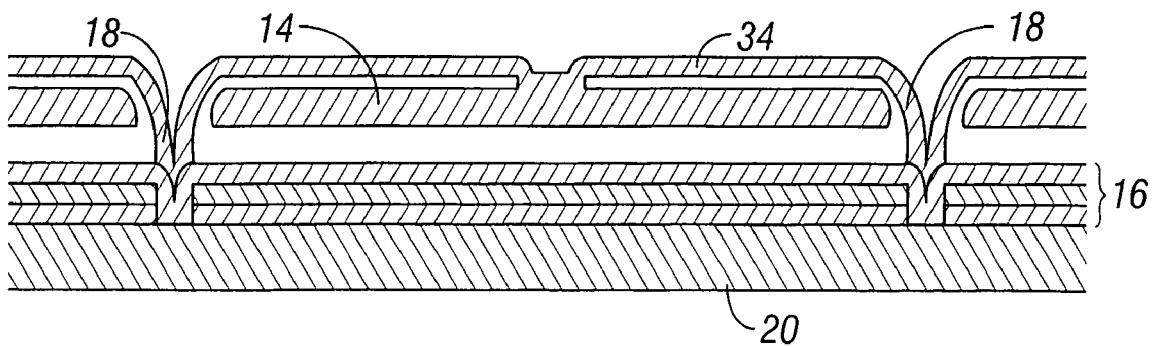
FIG. 7C is a cross section of another alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support structures, which can take the form of isolated pillars or posts and/or continuous walls or rails. The embodiment illustrated in FIG. 7D has support structures 18 that include support plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 7D:
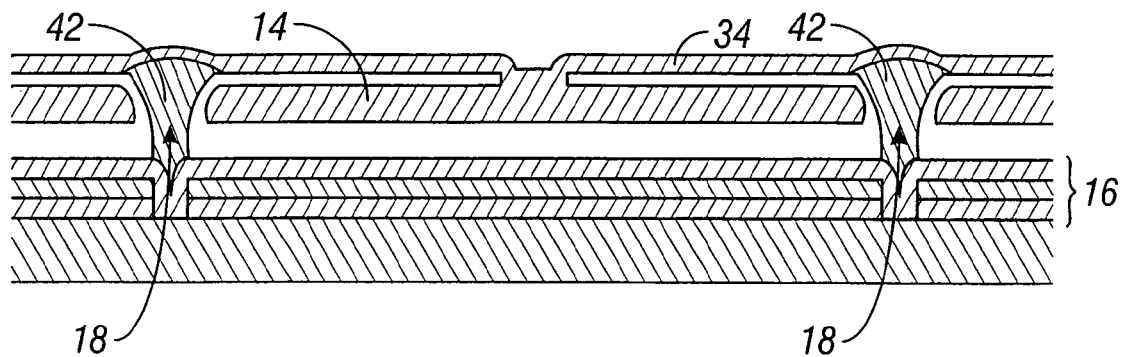
FIG. 7D is a cross section of yet another alternative embodiment of an interferometric modulator.
Figure 7E:
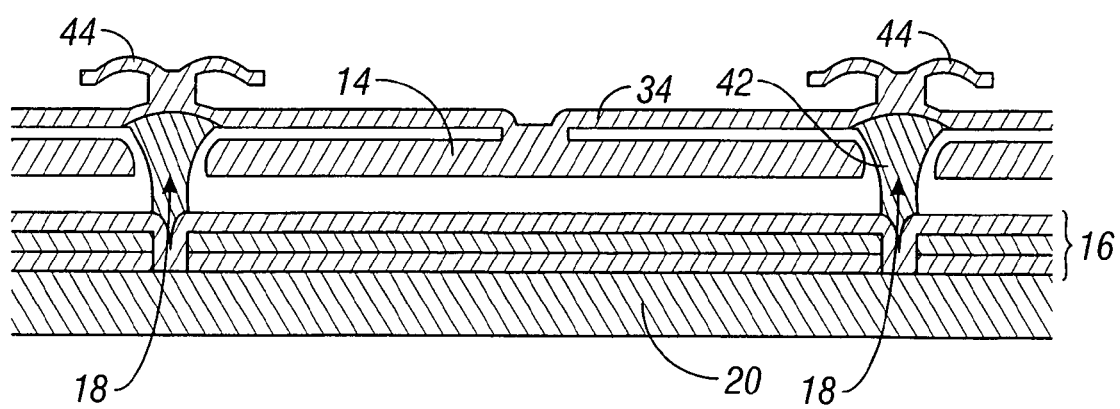
FIG. 7E is a cross section of an additional alternative embodiment of an interferometric modulator.

In certain embodiments, it may be desirable to provide additional support to a movable layer such as the movable reflective layer 14 illustrated in FIG. 7A, or the combination of mechanical layer 34 and movable reflective layer 14 of FIGS. 7C-7E. In optical MEMS devices, such as interferometric modulators, the movable layer may comprise a reflective sublayer and a mechanical sublayer, as will be discussed in greater detail below. Such support may be provided by a series of support structures which may be located along the edges of an individual modulator element and/or in the interior of such an element. In various embodiments, these support structures may be located either over or underneath a movable layer. In alternate embodiments, support structures may extend through an aperture formed in the mechanical layer, such that support is provided from both above and below the mechanical layer. As used herein, the term "rivet" generally refers to a patterned layer overlying a mechanical layer in a MEMS device, usually in a recess or depression in the post or support region, to lend mechanical support for the mechanical layer. Preferably, though not always, the rivet includes wings overlying an upper surface of the mechanical layer to add stability and predictability to the mechanical layer's movement. Similarly, support structures underlying a mechanical layer in a MEMS device to lend mechanical support for the mechanical layer are generally referred to herein as support "posts." In many of the embodiments herein, the preferred materials are inorganic for stability relative to organic resist materials.

Figure 8:
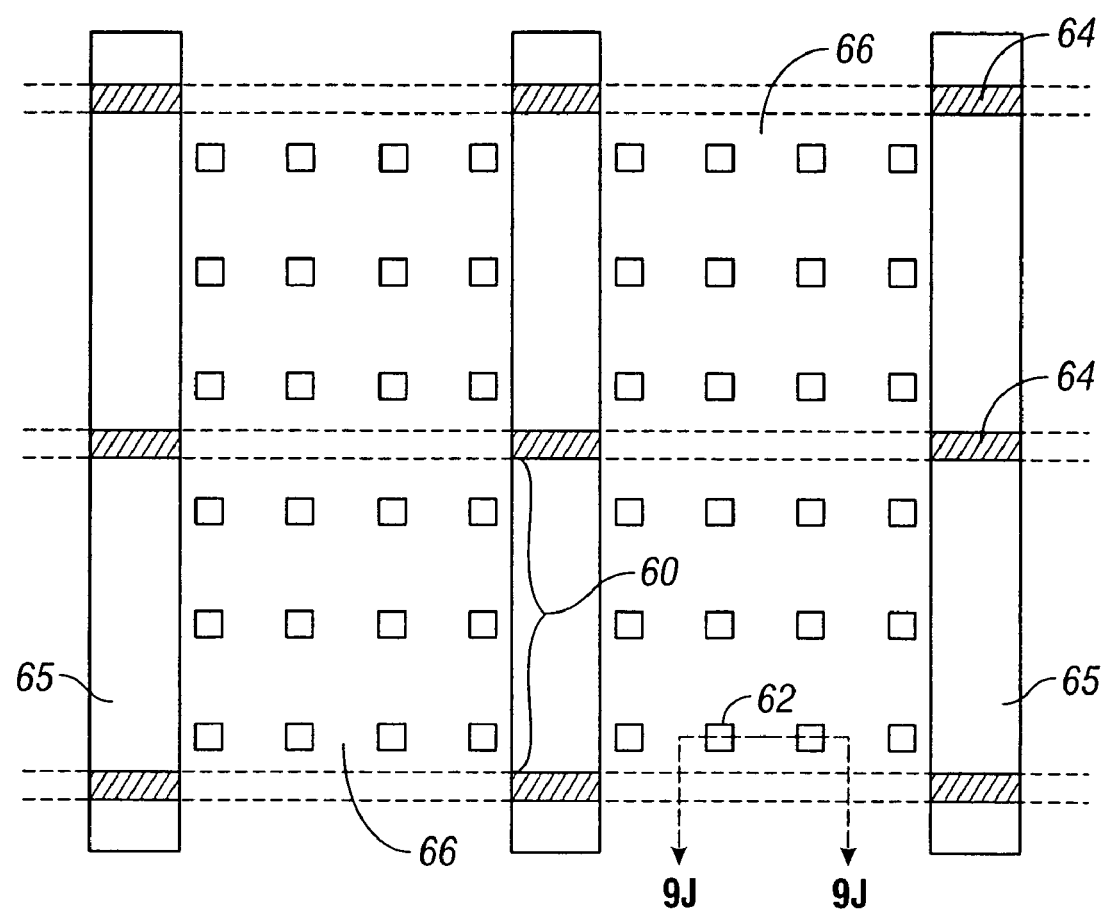
FIG. 8 is a top plan view of an array of interferometric modulator elements in which the individual elements comprise support structures.

An exemplary layout of such support structures is shown in FIG. 8, which depicts an array of MEMS elements. In certain embodiments, the array may comprise an array of interferometric modulators, but in alternate embodiments, the MEMS elements may comprise any MEMS device having a movable layer. It can be seen that support structures 62, which in the illustrated embodiment are underlying post structures but may in other embodiments include overlying rivet structures, are located both along the edges of a movable layer 66 and in the interior of a MEMS element, in this example an interferometric modulator element 60. Certain support structures may comprise rail structures 64, which extend across the gap 65 between two adjacent movable layers 66. It can be seen that movable layer 66 comprises a strip of deformable material extending through multiple adjacent elements 60 within the same column. The rail structures 64 run parallel with lower electrodes which define rows crossing the upper electrodes defined by the strips of the movable layer 66. The support structures 62 serve to stiffen the movable layer 66 within the elements or pixels 60, and together with the rail structures 64, separate the upper and lower electrodes to define cavities in which the upper electrode can move vertically.

Advantageously, these support structures 62 are made small relative to the surrounding area of the modulator element 60. As the support posts constrain deflection of the movable layer 66 and may generally be opaque, the area underneath and immediately surrounding the support structures 62 is not usable as active area in a display, as the movable layer in those areas is not movable to a fully actuated position (e.g., one in which a portion of the lower surface of the movable layer 14 of FIG. 7A is in contact with the upper surface of the optical stack 16). Because this may result in undesirable optical effects in the areas surrounding the post, a dark or "black" mask layer may advantageously be provided between the support structures and the viewer to avoid excessive reflection in these regions that may wash out the intended color.

In certain embodiments, these support structures may comprise a depression in the movable layer, along with a substantially rigid structure(s) above and/or below the movable layer which helps to maintain the shape. While such support structures may be formed of a polymer material, an inorganic material having greater rigidity is preferably used, and provides advantages over similar structures comprising polymeric materials.

For instance, a polymeric support structure may not maintain a desired level of rigidity over a wide range of operating temperatures, and may be subject to gradual deformation or mechanical failure over the lifetime of a device. As such failures may affect the distance between the movable layer and the optical stack, and this distance at least partially determines the wavelengths reflected by the interferometric modulator element, such failures may lead to a shift in the reflected color due to wear over time or variance in operating temperatures. Other MEMS devices experience analogous degradation over time when supports are formed of polymeric material.

Figure 9A:
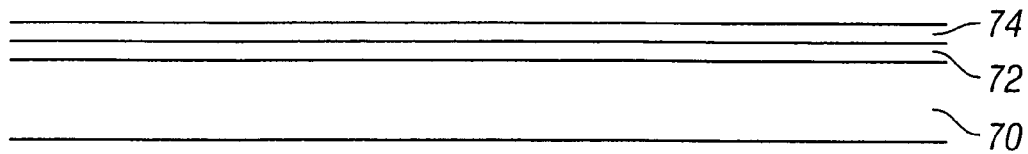
FIGS. 9A-9J are schematic cross-sections illustrating a method for fabricating an interferometric modulator element comprising support structures located over a movable layer.

One process for forming an interferometric modulator element comprising underlying post support structures is described with respect to FIGS. 9A-9J. In FIG. 9A, it can be seen that a transparent or light-transmissive substrate 70 is provided, which may comprise, for example, glass or a transparent polymeric material. A conductive layer 72, which may comprise indium-tin-oxide (ITO), is then deposited over the transparent substrate and a partially reflective layer 74, which may comprise chromium, is deposited over the conductive layer 72. Although in one embodiment conductive layer 72 may comprise ITO, and may be referred to as such at various points in the below specification, it will be understood that the conductive layer 72 may comprise any suitable conductive material, and need not be transparent for non-optical MEMS structures. Similarly, although sometimes referred to as a chromium layer, partially reflective layer 74 may comprise any suitable partially reflective layer, and may be omitted for non-optical MEMS structures.

Figure 9B:
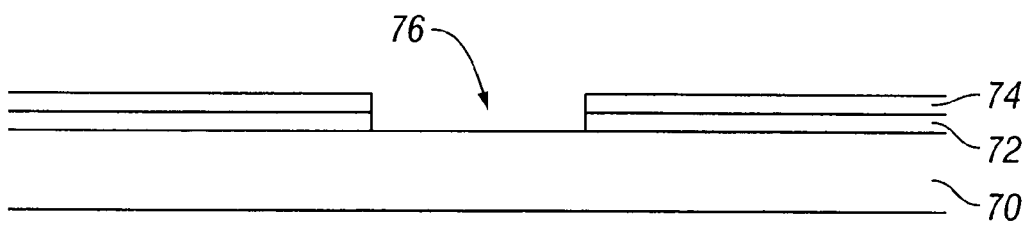

The conductive layer 72 and partially reflective layer 74 are then patterned and etched to form bottom electrodes, also referred to as row electrodes, which run cross-wise (e.g., perpendicular) to the movable layer 66 of FIG. 8 and which will be used to address a row of MEMS elements. In certain embodiments, the conductive and partially reflective layers 72 and 74 may advantageously also be patterned and etched to remove the ITO and chromium underlying the areas where the support post structures will be located, forming apertures 76 as depicted in FIG. 9B. This patterning and etching is preferably done by the same process which forms the row electrodes. The removal of ITO and chromium (or other conductive materials) underlying the support structures helps to minimize risk of shorting between an overlying conductive layer, such as the movable layer, and the bottom electrode. Thus, FIG. 9B and the subsequent figures depict a cross-section of a continuous row electrode formed by layers 72 and 74, in which isolated apertures 76 have been etched, taken along a line extending through those apertures. In other embodiments in which the conductive layer 72 and partially reflective layer 74 are not etched to form apertures 76, a dielectric layer, discussed below, may provide sufficient protection against shorting between the bottom electrode and the movable layer.

Figure 9C:
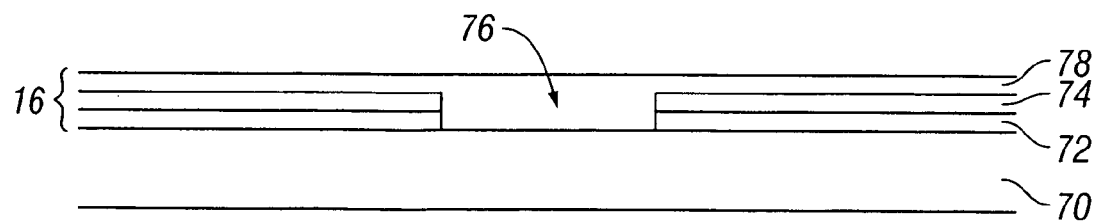

The conductive layer 72 and partially reflective layer 74 may be patterned via photolithography and etched via, for example, commercially available wet etches. Chromium wet etches include solutions of acetic acid ($C_2H_4O_2$) and cerium ammonium nitrate [$Ce(NH_4)_2(NO_3)_6$]. ITO wet etches include HCl, a mixture of HCl and $HNO_3$, or a mixture of $FeCl_3$/HCl/DI in a 75%/3%/22% ratio and $H_2O$. Once the apertures 76 have been formed, a dielectric layer 78 is deposited over the conductive and partially reflective layers 72 and 74, as seen in FIG. 9C, forming the optical stack 16. In certain embodiments, the dielectric layer may comprise $SiO_2$ or $SiN_x$, although a wide variety of suitable materials may be used.

The thickness and positioning of the layers forming the optical stack 16 determines the color reflected by the interferometric modulator element when the element is actuated (collapsed), bringing the movable layer 66 into contact with the optical stack. In certain embodiments, the optical stack is configured such that the interferometric modulator element reflects substantially no visible light (appears black) when the movable layer is in an actuated position. Typically, the thickness of the dielectric layer 78 is about 450 Å, although it will be understood that the desired thickness will vary based on both the refractive index of the material and the desired color reflected by the interferometric modulator in a collapsed state. While illustrated for simplicity as planar (which can be achieved if the dielectric layer 78 is a spin-on glass), the dielectric layer 78 is typically conformal over the patterned lower electrode formed from layers 72 and 74.

Figure 9D:
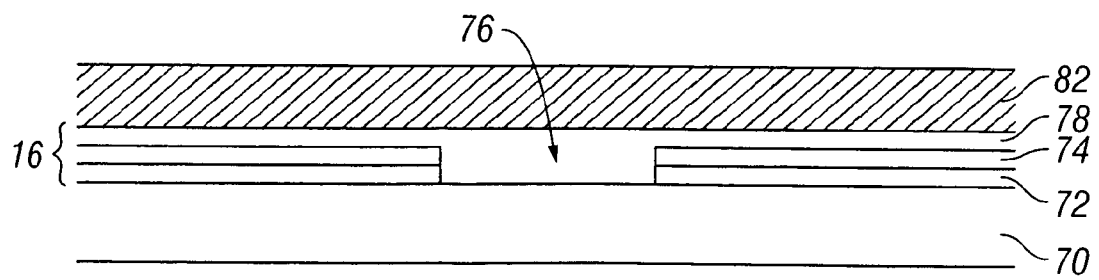

As seen in FIG. 9D, a layer 82 of sacrificial material is then deposited over the dielectric layer 78. In certain embodiments, this sacrificial layer 82 is formed from a material which is etchable by fluorine-based etchants, particularly $XeF_2$. For example, the sacrificial layer 82 may be formed from molybdenum or amorphous silicon (a-Si). In other embodiments, the sacrificial layer may comprise tantalum or tungsten. Other materials which are usable as sacrificial materials include silicon nitride, certain oxides, and organic materials. The thickness of the deposited sacrificial layer 82 will determine the distance between the optical stack 16 and the movable layer 66, thus defining the dimensions of the interferometric gap 19 (see FIG. 7A). As the height of the gap 19 determines the color reflected by the interferometric modulator element when in an unactuated position, the thickness of the sacrificial layer 82 will vary depending on the desired characteristics of the interferometric modulator. For instance, in an embodiment in which a modulator element that reflects green in the unactuated position is formed, the thickness of the sacrificial layer 82 may be roughly 2000 Å. In further embodiments, the sacrificial layer may have multiple thicknesses across an array of MEMS devices, such as in a multi-color display system where different interferometric gap sizes are used to produce different colors.

Figure 9E:
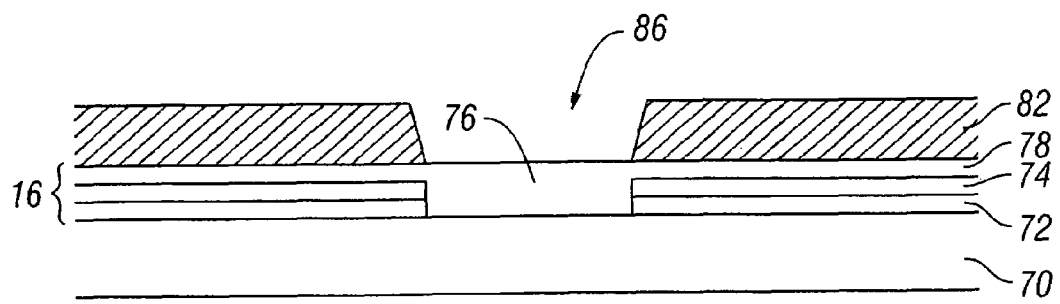

In FIG. 9E, it can be seen that the sacrificial layer 82 has been patterned and etched to form tapered apertures 86. The apertures 86 overlie the apertures 76 cut into the layers 72 and 74 of ITO and chromium. These apertures 86 may be formed by masking the sacrificial layer, using photolithography, and then performing either a wet or dry etch to remove portions of the sacrificial material. Suitable dry etches include, but are not limited to, $SF_6$, $CF_4$, $Cl_2$, or any mixture of these gases with $O_2$ or a noble gas such as He or Ar. Wet etches suitable for etching Mo include a PAN etch, which may be a mix of phosphoric acid, acetic acid, nitric acid and deionized water in a 16:1:1:2 ratio. Amorphous silicon can be etched by wet etches including KOH and HF Nitrate. Preferably, however a dry etch is used to etch the sacrificial layer 82, as dry etches permit more control over the shape of tapered apertures 86.

Figure 9F:
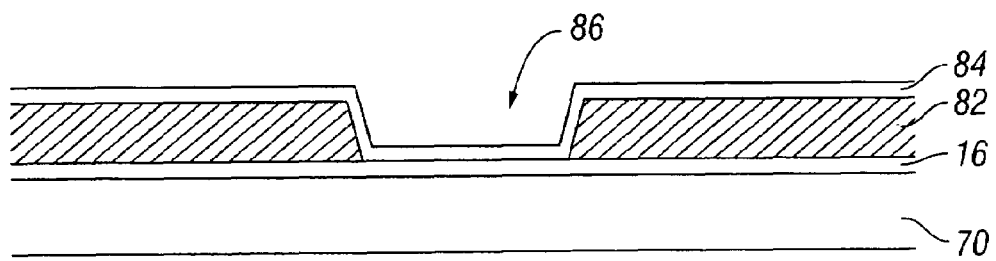

In FIG. 9F a layer 84 of inorganic post material is deposited over the patterned sacrificial layer 82, such that the inorganic post layer 84 also coats the side walls and the base of the tapered apertures 86. In certain embodiments, the inorganic post layer 84 is thinner than the sacrificial layer 82, and is conformal over the sacrificial layer 82. In certain embodiments, the inorganic post layer 84 may comprise silicon nitride ($SiN_x$) or $SiO_2$, although a wide variety of other materials may be used, some of which are discussed in greater detail below.

Figure 9G:
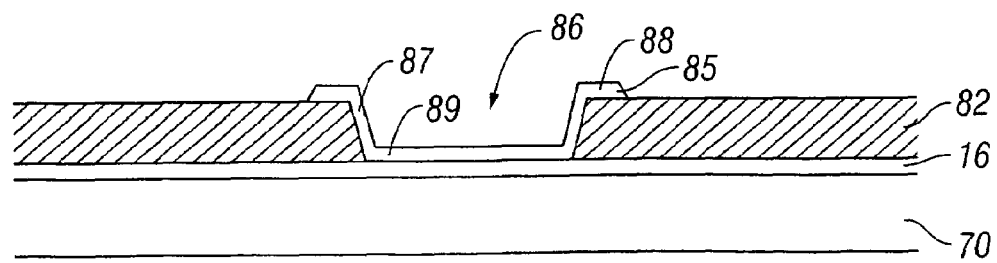

In FIG. 9G, the inorganic post layer 84 is patterned and etched to form inorganic posts 88. Thus, the inorganic post layer 84 is preferably selectively etchable with respect to the underlying sacrificial layer 82, so as to permit etching of inorganic post layer 84 while leaving the sacrificial layer 82 unaffected. However, if the inorganic post layer 84 is not selectively etchable relative to the sacrificial layer 82, an etch stop layer (not shown) may be provided between the inorganic post layer 84 and the sacrificial layer 82.

It can be seen in FIG. 9G that the edges of the inorganic posts 88 preferably taper which, like the tapered or sloped sidewalls of the apertures 86, facilitates continuous and conformal deposition of overlying layers. It can be seen that the post structure 88 in the illustrated embodiment has a thickness which is thinner than that of the sacrificial layer 82, and comprises a substantially flat base portion 89, a sloped sidewall portion 87, and a substantially horizontal wing portion 85 which extends over a portion of the sacrificial material. Thus, the post 88 advantageously provides a substantially flat surface at the edge of the post for supporting an overlying movable layer 66 (see FIG. 9H), minimizing stress and the resultant undesired deflection which might occur if the movable layer 66 were deposited over a less flat edge. Details of how to taper structures like the post 88 of FIG. 9H are discussed with respect to FIGS. 11A-21, below.

In one embodiment, the inorganic post layer 84 and resultant post 88 comprise diamond-like carbon (DLC). In addition to being extremely hard and stiff (roughly 10× harder than $SiO_2$), the DLC inorganic post layer 84 can be etched with an $O_2$ dry etch. Advantageously, an $O_2$ dry etch is highly selective relative to a wide variety of sacrificial materials, including but not limited to Mo and a-Si sacrificial material, as well as other sacrificial materials discussed above. An inorganic post comprising DLC thus provides a very stiff post, lessening the likelihood and amount of downward flexure of the edges of the support post 88 when overlying moving or mechanical layers are pulled downward during MEMS operation, while permitting the use of an etch which is relatively benign to a wide variety of materials.

Figure 9H:
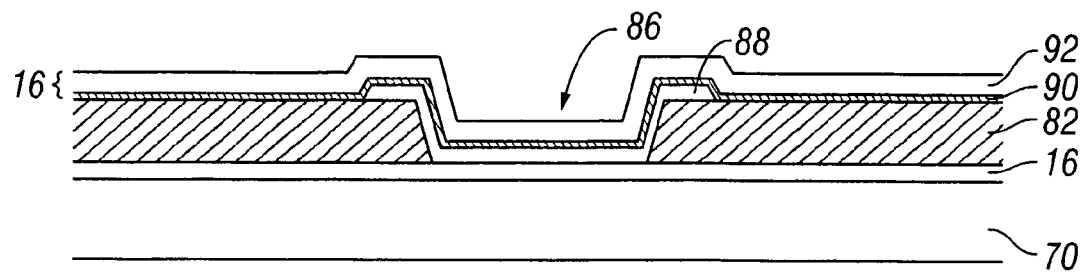

In FIG. 9H, it can be seen that the components which will form the movable layer 66 (see, e.g., moveable reflective layer 14 in FIG. 7A) are then deposited over the etched sacrificial layer 82, lining the tapered apertures 86. In the embodiment of FIG. 9H, a highly reflective layer 90, also referred to as a mirror or mirror layer, is deposited first, followed by a mechanical layer 92. The highly reflective layer 90 may be formed from a specular metal, such as aluminum or an aluminum alloy, due to their high reflectance over a wide spectrum of wavelengths. The mechanical layer 92 may comprise a metal such as Ni and Cr, and is preferably formed such that the mechanical layer 92 contains residual tensile stress. The residual tensile stress provides the mechanical force which tend to pull the movable layer 66 away from the optical stack 16 when the modulator is unactuated, or "relaxed." For convenience, the combination of the highly reflective layer 90 and mechanical layer 92 is collectively referred to as the movable layer 66, although it will be understood that the term movable layer, as used herein, also encompasses a partially separated mechanical and reflective layer, such as the mechanical layer 34 and the movable reflective layer 14 of FIG. 7C.

In an embodiment in which the sacrificial layer is to be "release" etched by a $XeF_2$ etch, both the reflective layer 90 and the mechanical layer 92 are preferably resistant to $XeF_2$ etching. If either of these layers is not resistant, an etch stop layer may be used to protect the non-resistant layer surface exposed to the release etch. Similarly, the post 88 is preferably resistant to the release etch, or is alternately protected by an etch stop layer. It can also be seen that the taper of the edges of the posts 88 facilitates the conformal deposition of the reflective layer 90 and mechanical layer 92. Absent this taper, it may be difficult to deposit these layers such that the layers have substantially uniform thicknesses over surfaces outside and within the apertures 86.

In an alternate embodiment, the movable layer 66 may be a single layer which is both highly reflective and has the desired mechanical characteristics. However, the deposition of two distinct layers permits the selection of a highly reflective material, which might otherwise be unsuitable if used as the sole material in a movable layer 66, and similarly allows selection of a suitable mechanical layer (with some flexibility and inherent tension) without regard to its reflective properties. In yet further embodiments, the movable layer may be a reflective sublayer which is largely detached from the electrical and mechanical layer, such that the reflective layer may be translated vertically without bending (see, e.g., FIGS. 19A-10F and attendant description).

In other embodiments in which the MEMS devices being formed comprise non-optical MEMS devices (e.g., a MEMS switch), it will be understood that the movable layer 66 need not comprise a reflective material. For instance, in embodiments in which MEMS devices such as MEMS switches are being formed comprising the support structures discussed herein, the underside of the movable layer 66 need not be reflective, and may advantageously be a single layer, selected solely on the basis of its mechanical properties or other desirable properties.

Figure 9I:
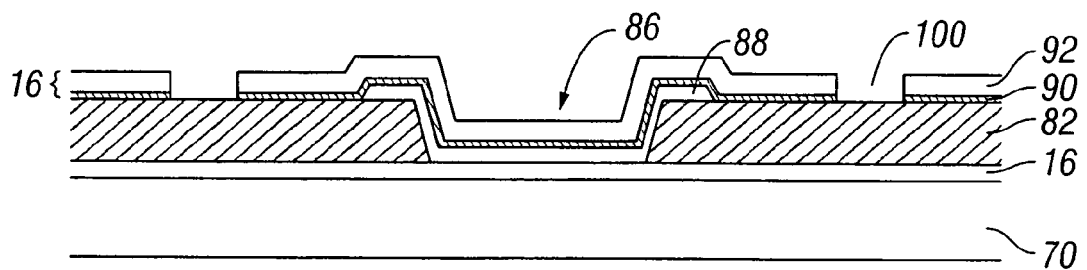

Next, in FIG. 9I, it can be seen that photolithography is used to pattern the mechanical layer 92, and etch the movable layer 66 (i.e., the mechanical layer 92 and the reflective layer 90) to form etch holes 100, which expose portions of the sacrificial layer 82, in order to facilitate "release" etching of the sacrificial layer. In certain embodiments, multiple etches are employed to expose the sacrificial layer. For example, if the mechanical layer 92 comprises nickel and the reflective layer 90 comprises aluminum, $HNO_3$ may be used to etch the mechanical layer 92, and phosphoric acid or a base such as $NH_4OH$, KOH, THAM, or NaOH may be used to etch the reflective layer 90. This patterning and etching may also be used to define the strip electrodes seen in FIG. 8, by etching gaps 65 between strips of the movable layer 66 (see FIG. 8), separating columns of MEMS devices from one another.

Figure 9J:
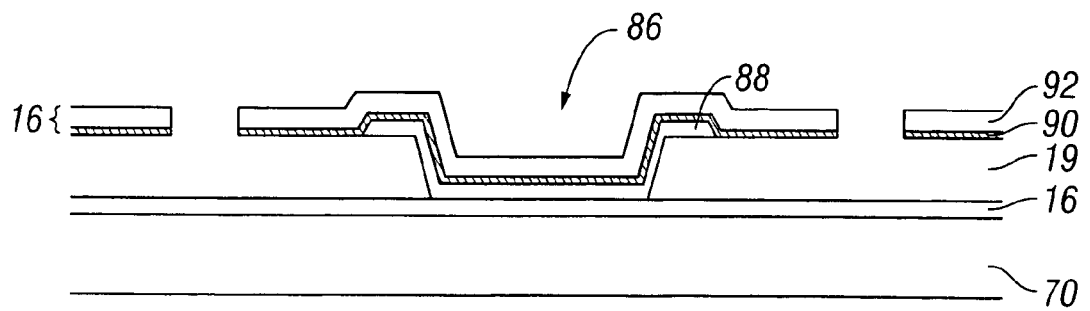

Finally, in FIG. 9J, it can be seen that a release etch is performed to remove the sacrificial layer, creating the interferometric gap 19 through which the movable layer 66 can move. In certain embodiments, a $XeF_2$ etch is used to remove the sacrificial layer 82. Because $XeF_2$ etches the preferred sacrificial materials well, and is extremely selective relative to other materials used in the processes discussed above, the use of a XeF$_2$ etch advantageously permits the removal of the sacrificial material with very little effect on the surrounding structures.

As discussed above, certain embodiments of MEMS devices, and in particular interferometric modulators, comprise a movable layer comprising a reflective layer which is partially detached from a mechanical layer. FIGS. 10A-10F illustrate an exemplary process for forming separate mirror structures underlying the mechanical layer in such a MEMS device, which in the illustrated embodiment is an interferometric modulator. This process may include, for example, the steps described with respect to FIGS. 9A-9D, in which an optical stack is deposited, and a sacrificial layer is deposited over the optical stack.

Figure 10A:
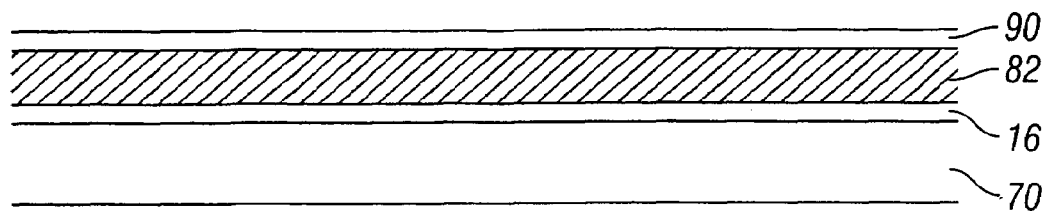
FIGS. 10A-10F are schematic cross-sections illustrating a method for fabricating an interferometric modulator element comprising a reflective layer which is partially separated from a mechanical layer.

In FIG. 10A, it can be seen that a reflective layer 90 is deposited over the sacrificial layer 82. In certain embodiments, the reflective layer 90 may comprise a single layer of reflective material. In other embodiments, the reflective layer 90 may comprise a thin layer of reflective material with a layer of more rigid material (not shown) overlying the thin layer of sacrificial material. As the reflective layer of this embodiment will be partially detached from an overlying mechanical layer, the reflective layer 90 preferably has sufficient rigidity to remain in a substantially flat position relative to the optical stack 16 even when partially detached, and the inclusion of a stiffening layer on the side of the reflective layer located away from the optical stack can be used to provide the desired rigidity.

Figure 10B:
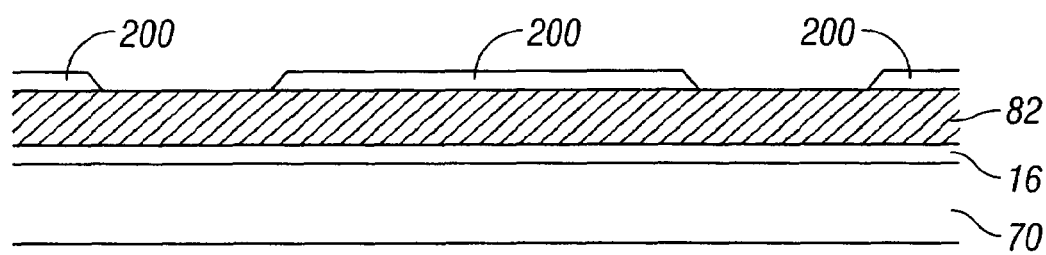

In FIG. 10B, the reflective layer 90 of FIG. 10A is patterned to form a patterned mirror layer 200. In one embodiment, the patterned mirror layer 200 comprises a contiguous layer in which apertures corresponding to the locations of (but wider or narrower than) support structures have been formed. In another embodiment, the patterned mirror layer 200 may comprise multiple reflective sections detached from one another.

Figure 10C:
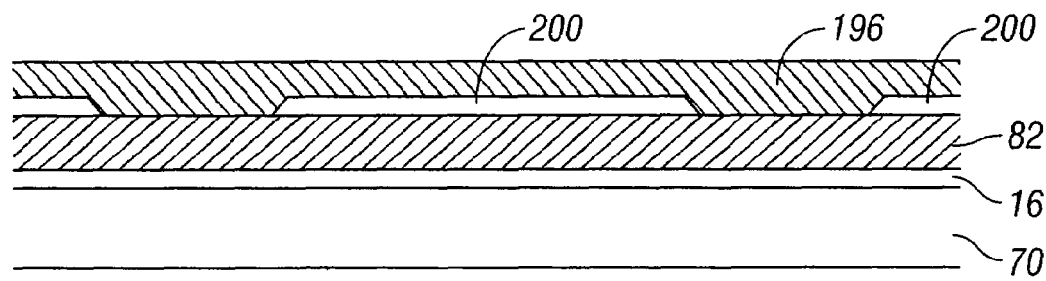

In FIG. 10C, a second sacrificial layer 196 is deposited over the patterned mirror layer 200. Preferably, the second sacrificial layer 196 is formed from the same material as the first sacrificial layer 82, or is etchable selectively with respect to surrounding materials by the same etch as the first sacrificial layer 82.

Figure 10D:
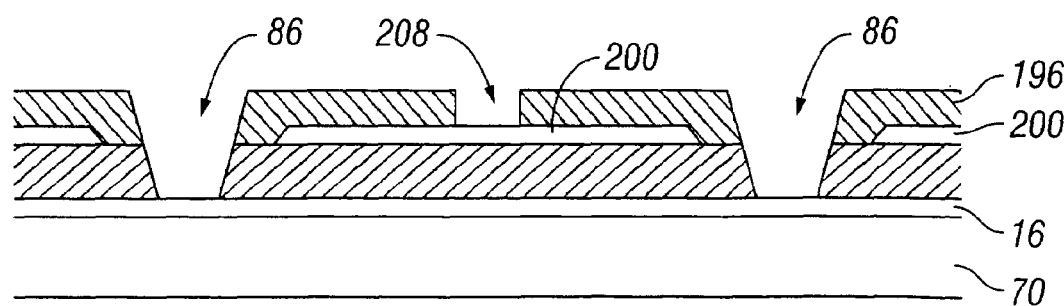

In FIG. 10D, tapered apertures 86 are formed which extend through both the second sacrificial layer 196 and the first sacrificial layer 82. It can also be seen in FIG. 35D that an aperture 208 is formed in a portion of the second sacrificial layer 196 overlying the patterned mirror layer 200, exposing at least a portion of the patterned mirror layer 200.

Figure 10E:
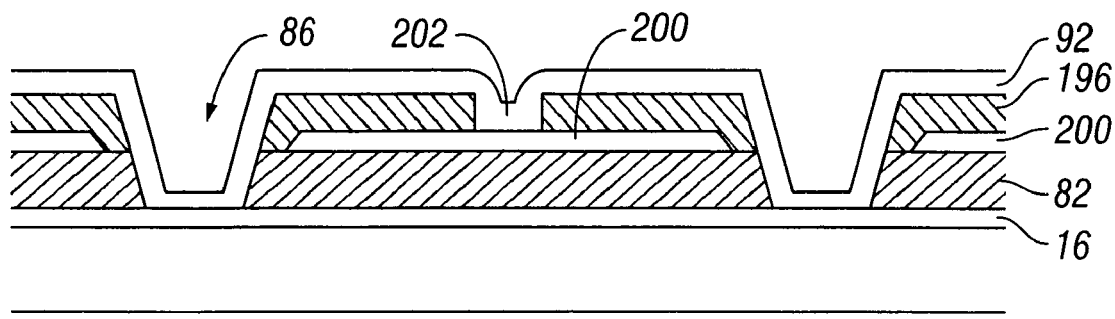

In FIG. 10E, a mechanical layer 92 is deposited over the patterned sacrificial layers 196 and 82 and exposed portions of the patterned mirror layer 200. In particular, it can be seen that the mechanical layer 92 at least partially fills the aperture 208 (see FIG. 10D), such that a connector portion 202 connecting the mechanical layer 92 and the patterned mirror layer 200 is formed.

Figure 10F:
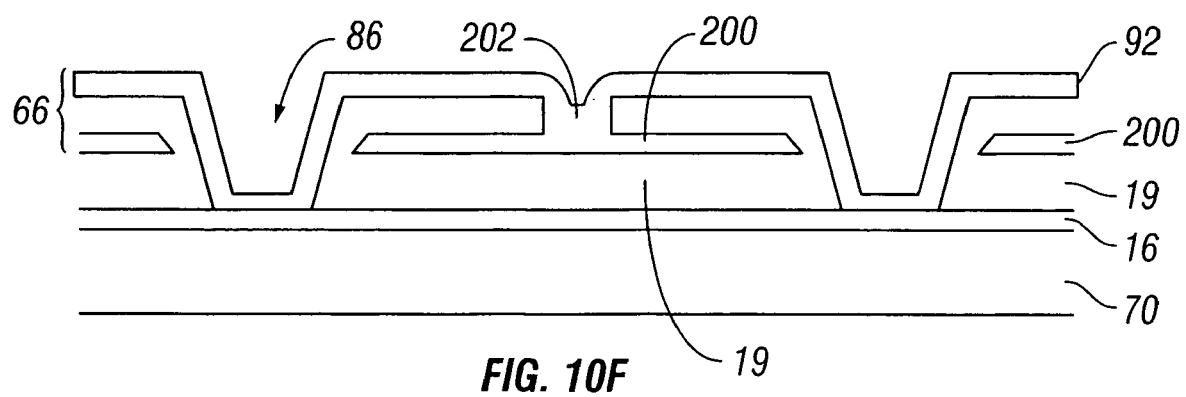

In FIG. 10F, a release etch is performed which removes both the first sacrificial layer 82 and the second sacrificial layer 196, thereby forming an interferometric gap 19 between the patterned mirror layer 200 and the optical stack. Thus, an optical MEMS device is formed, which includes a movable layer 66 comprising a mechanical layer 92 from which a patterned mirror layer 200 is suspended, where the patterned mirror layer 200 is partially detached from the mechanical layer 92. This optical MEMS device, may be, for example, an interferometric modulator such as that described with respect to FIG. 7C and elsewhere throughout the application. In non-optical MEMS, the suspended upper electrode need not be reflective.

In the embodiment of FIG. 10F, it is undesirable for the patterned mirror layer 200 to have a re-entrant edge surface, as undercutting the mirror layer may lead to undesirable optical effects if incident light is reflected off of the re-entrant edge surface and reflected towards the viewer. Desirably, the patterned mirror layer 200 comprises a flat lower surface, such that any light reflected by the patterned mirror layer 200 is reflected in a uniform direction. One method for ensuring that the patterned mirror layer 200 comprises a substantially flat surface without significant undercut, is to etch the mirror layer such that the patterned mirror layer comprises a tapered edge. In addition, if the patterned mirror layer 200 comprises a tapered edge, the second sacrificial layer and other overlying layers 9 e.g., the mechanical layer) can be more reliably deposited conformally over the patterned mirror layer 200, with less risk of thickness nonuniformity and stresses created at sharper 90 degree corners.

Thus, it is often desirable to form tapered edges in a variety of locations throughout a MEMS device, including when overlying layers are to be deposited conformally over the patterned layer, or when it is desirable to avoid a re-entrant profile. Several methods are disclosed below for the formation of such tapered edges. While they are described primarily with respect to the post embodiment discussed above with respect to FIGS. 9A-9J, other uses of the structures and methods are contemplated (such as in the patterning of the mirror layer 200 of FIGS. 10A-10F) and can be achieved through modification of the below structures and methods. In certain embodiments, these processes include patterning a layer to form a desired structure and tapering the edge of that structure. Although sometimes described as two distinct steps, it will be understood that the patterning and tapering will often comprise a single step, and that in further embodiments, partial tapering will occur while the structure is being patterned, such that the patterning and tapering need may be done simultaneously.

Figure 11A:
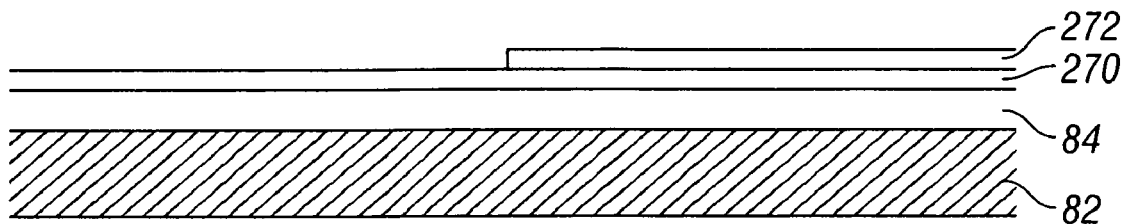
FIGS. 11A-11B are schematic cross-sections illustrating a method for forming a MEMS structure having a tapered edge through the use of an etch leading layer.
Figure 11B:
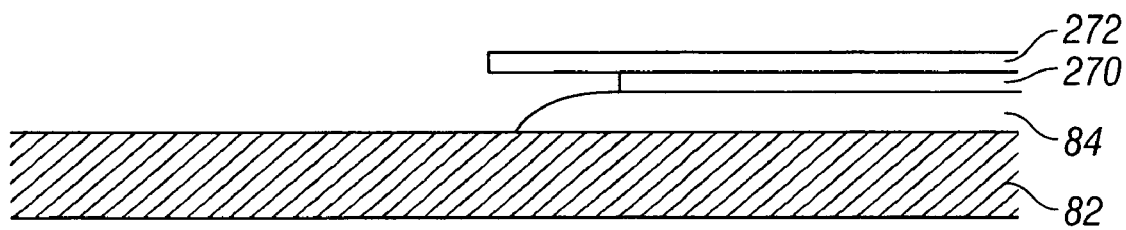

In one embodiment, described with respect to FIGS. 11A-11B, an etch leading layer is used to achieve an etch having the desired taper. In FIG. 11A, it can be seen that a layer of inorganic post material 84 is deposited over a sacrificial layer 82. An etch leading layer 270 is deposited over the post layer 84, and a mask 272 is formed over the area where the inorganic post will be. In this embodiment, the etch leading layer is selected to be a material which, for particular etches, will have an etch rate which is faster than the etch rate of the underlying material, or the post material 84 in the illustrated embodiment. In certain embodiments, the post layer 84 may comprise SiO$_2$ or SiN$_x$. The etch leading layer may comprise a wide variety of materials, including an SiO$_2$ or SiN$_x$ layer which are deposited at a low temperature; are significantly more porous than the underlying layer; are deposited with a different composition of nitrogen in the SiN$_x$ layer; or are formed to be particularly oxygen or nitrogen rich. Similarly, a hydrogen rich SiN$_x$ layer may be used, or a layer of SiN$_x$ deposited at low temperatures. Si is etched faster than SiO$_2$ when a HF/HNO$_3$ etch is used, and Al will etch faster than SiO$_2$ when an HF+H$_3$PO$_4$ etch is used. Also, Mo will etch faster than SiO$_2$ when either a HF/HNO$_3$ or an HF/HNO$_3$/H$_3$PO$_4$ etch is used. BHF is commonly used to etch SiN$_x$ although other suitable etchants may be used. A wide variety of other etches and etch leading layers may be used depending on the composition of the inorganic post layer 84. Depending on the etchant to be used, the mask 272 may be formed of, for example, a hard mask such as Ni, or a photoresist mask. In particular, when a wet etch is used, the mask 272 may comprise a hard mask.

FIG. 11B depicts the embodiment of FIG. 11A after being exposed to an etchant, preferably an isotropic etchant. As can be seen, the etch leading layer 270 has been etched faster than the post layer 84, exposing both the top and the side of the post layer 84 to the etchant. Because the post layer 84 is etched from the top and from the side, a tapered side has been formed by this etch. Subsequently, one or both of the mask 272 and the remaining etch leading layer 270 may be removed (not shown).

The structure and method of FIGS. 11A-11B may be adapted for use in forming a patterned mirror layer having a tapered edge. In one embodiment, the inorganic post layer 84 of FIGS. 11A-11B may be replaced by a layer of aluminum, and the etch leading layer 270 may be, for example, a layer of aluminum deposited such that it will etch faster. This can be achieved, for instance, though deposition of the etch leading layer at a higher pressure than the deposition of the lower aluminum layer. In an alternate embodiment, the etch leading layer may comprise an aluminum alloy having a higher etch rate than aluminum. In still other embodiments, any suitable material having the desired mechanical properties and a higher etch rate than aluminum may be used.

Figure 12A:
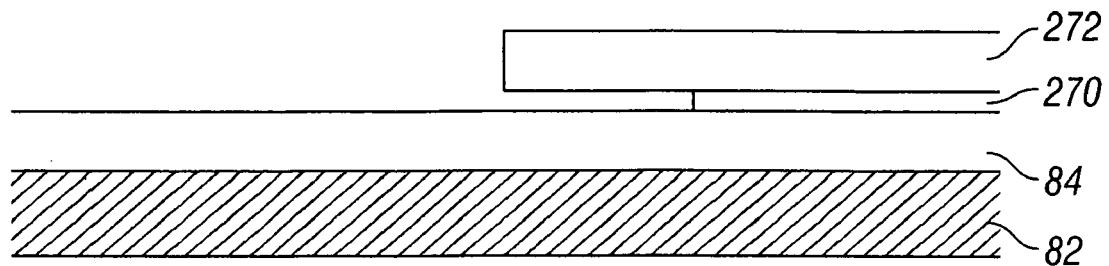
FIGS. 12A-12B are schematic cross-sections illustrating an alternate method for forming a MEMS structure having a tapered edge through the use of an etch leading layer.
Figure 12B:
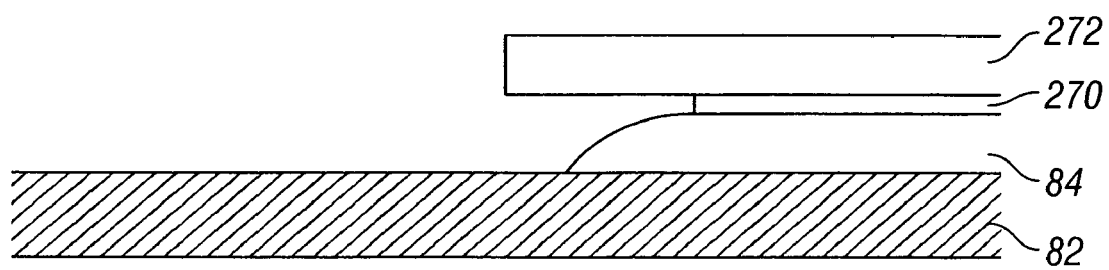

A variation of the above embodiment is discussed with respect to FIGS. 12A-12B, and includes the step of FIG. 11A. In this embodiment, the etch leading layer 270 and the underlying layer (in the illustrated embodiment, inorganic post material 84) are selectively etchable relative to one another. In FIG. 12A, it can be seen that the etch leading layer 270 has been selectively etched relative to the post layer 84 via a first (preferably isotropic) etch, exposing part of the top of the post layer 84. In FIG. 12B, a second (preferably isotropic) etch has been used to etch the post layer 84 both from above and from the side, resulting in the tapered edge seen in the figure. The angle of the taper can be controlled both by the extent to which the first etch is permitted to remove the etch leading layer 270, and by the rate at which the second etch diffuses into the space between the mask 272 and the post layer 84. If the second etch etches the post layer 84 such that it undercuts the etch leading layer 270, a third etch, which may use the same etch as the first etch, may be performed in order to remove the overhanging portion of the etch leading layer 270, such that a tapered edge is formed without undesirable overhanging portions.

The structure and method of FIGS. 12A-12B may also be adapted for use in forming a patterned mirror layer having a tapered edge. In one embodiment, the inorganic post layer 84 of FIGS. 12A-12B may be replaced by a layer of aluminum, and the etch leading layer 270 may comprise a layer of nickel, which can be selectively etched relative to aluminum. The nickel etch leading layer may first be etched, such as via a $HNO_3$ wet etch, which is selective with respect to the aluminum layer. The aluminum layer may then be etched via an $H_3PO_4$ wet etch, which is selective with respect to the nickel layer. If necessary, a subsequent $HNO_3$ etch is performed to remove any portions of the nickel layer overhanging the tapered aluminum layer.

As discussed above, one or both of the etch leading layer and the mask may be removed after etching the inorganic post layer. In a further embodiment, the etch leading layer of any of the embodiments discussed herein may be selected so that it can be etched away or otherwise removed in a single process. In a particular embodiment, the etch leading layer is a polymeric material, such as PMGI or PMMA, and the mask is a photoresist mask. The undercut can be achieved during the photolithography process and it does not require an extra etch step. In this embodiment, a single etch (different from the first etch) an remove both the PR mask and the polymeric etch leading layer, simplifying the fabrication process.

Figure 13:
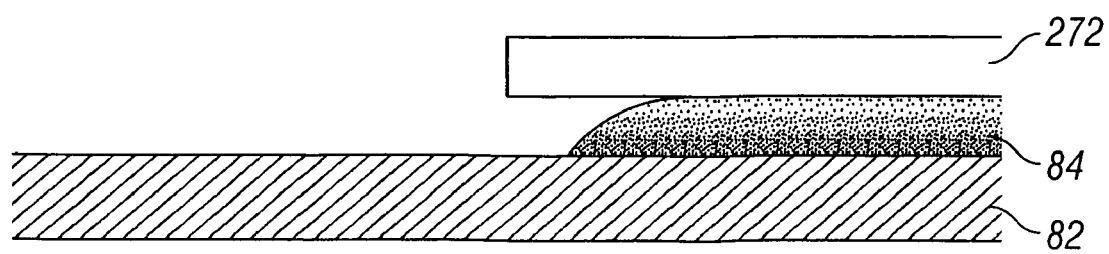
FIG. 13 is a schematic cross-section illustrating a step in a method for forming a MEMS structure having a tapered edge by altering the properties of the support structure layer during formation of the MEMS structure layer.
Figure 14:
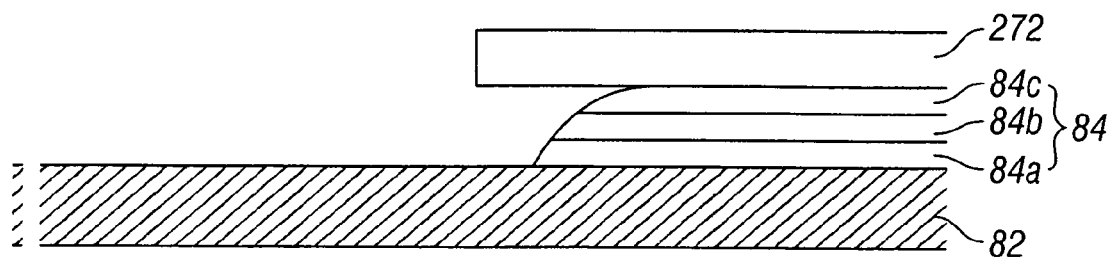
FIG. 14 is a schematic cross-section illustrating a step in a method for forming a MEMS structure having a tapered edge by forming a series of sublayers having differing properties to form the MEMS structure layer.

In another embodiment, the desired taper can be achieved through the deposition of a post layer 84 which has differing properties at different heights in the layer, such that the upper portion of the layer 84 will be etched at a faster rate than the lower portion of the layer 84, rather than employing a separate etch leading layer. FIG. 13 depicts such an embodiment, in which the properties of the layer 84 are varied during the formation (e.g., deposition) of the layer, such that the layer 84 has been etched into a tapered shape. Such varying properties can be achieved in multiple ways. For example, during plasma chemical vapor deposition, process conditions such as the gas, power and/or pressure may be varied (graded through the thickness) in order to make the composition of later-deposited material more quickly etchable by a particular etch. This variation can also be achieved while using a sputter etch process Similarly, as can be seen in FIG. 14, a single layer 84 of inorganic post material with varying properties can be approximated through the deposition of multiple layers having slightly different properties. In this embodiment, three separate layers 84a, 84b, and 84c are fabricated, such that layers 84b and 84c have an etch rate faster than 84a, and 84c has an etch rate faster than 84b, upon exposure to a particular etchant. In various embodiments, more or less layers of varying or uniform thickness can be deposited to form such a stratified post layer. As discussed above, various properties of a CVD or sputter etch process can be modified between the deposition of the various post layers in order to achieved the desired relative etch rates for each layer. This process can also be applied to the deposition of a mirror layer or any other layer.

Figure 15:
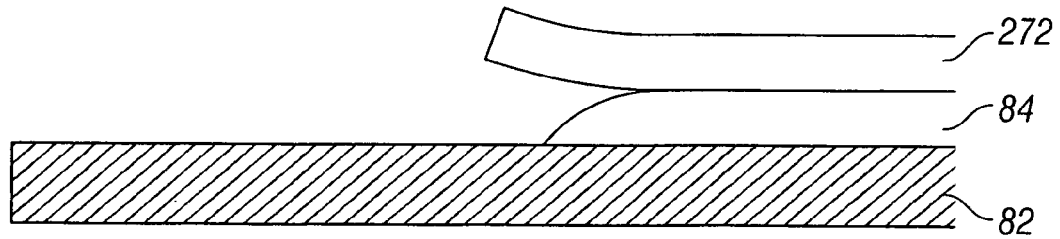
FIG. 15 is a schematic cross-section illustrating a step in a method for forming a MEMS structure having a tapered edge by forming an overlying mask layer having poor adhesion to the MEMS structure layer.

In another embodiment, as depicted in FIG. 15, a mask layer 272 can be deposited over the post layer 84 such that the adhesion between the mask 272 and the post layer 84 is intentionally poor. During etching of the post layer 84, the mask 272 will pull away from the post layer 84, permitting the post layer 84 to be etched from above, as well as from the side, creating the desired tapered shape. Preferably, the etch used to etch the post layer 84 is a wet etch or an isotropic dry etch. The resist adhesion can be modified during the fabrication process by, for example, lowering the bake temperature of the mask 272, or chemically treating the upper surface of the post layer 84 to reduce adhesion with the resist 272 or other mask material. This process can also be applied to the etching of a mirror layer or any other layer.

Figure 16A:
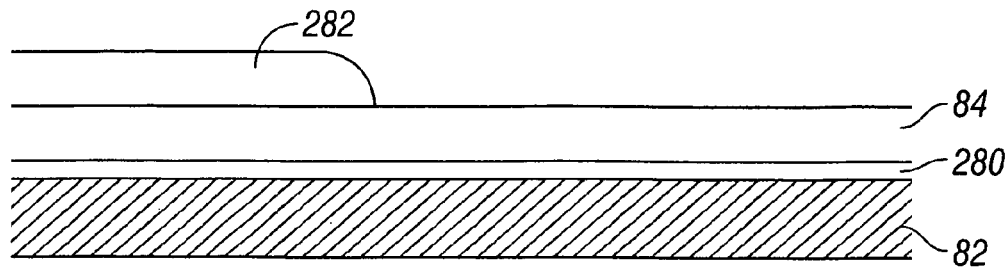
FIGS. 16A-D are schematic cross-sections illustrating a method for forming a MEMS structure having a tapered edge through the use of an iterative ashing and etching process.

In yet another embodiment, a tapered edge can be approximated through the deposition of a photoresist mask over the inorganic post layer and the use of successive etching and ashing processes to gradually remove portions of that photoresist mask, forming a staircase-like structure. FIGS. 16A-16D depict a method of forming such a staircase pattern at the edge of an inorganic structure such as the post of FIG. 9J. In FIG. 16A, it can be seen that an etch barrier layer 280 has been formed between a layer 84 of post material and the sacrificial layer 82. A mask layer 282 is then deposited over the post layer 84.

Figure 16B:
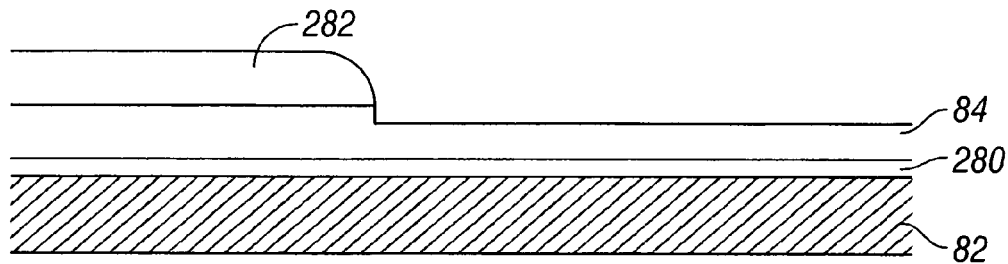

In FIG. 16B, an etch is performed to remove a portion of the exposed post layer 84. As shown in the illustrated embodiment, this etch may only remove a portion of the exposed post layer 84, but in other embodiments, the first etch may etch the entire exposed portion of the post layer, stopping on the etch stop layer 280.

Figure 16C:
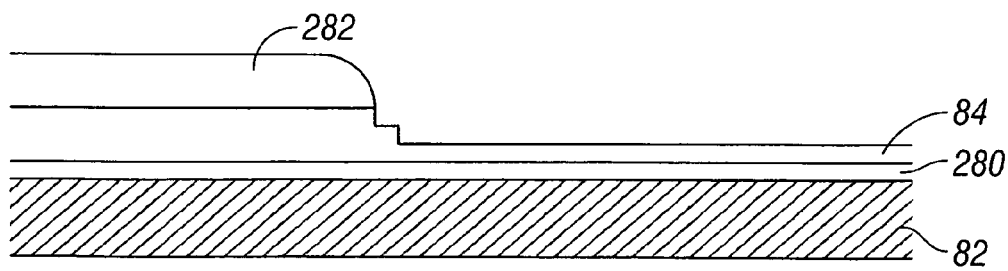
Figure 16D:
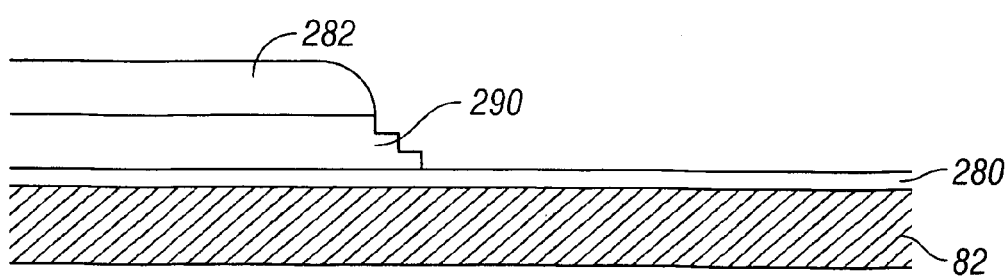

In FIG. 16C, a portion of the mask 282 has been removed, such as by an ashing process, and another etch is performed to remove another newly exposed portion of the post layer 84. This process is then repeated until the post layer 84 has been etched all the way down to the etch barrier layer 282 in certain places, as can be seen in FIG. 36D. Thus, inorganic posts 290 may be fabricated, having edges with a staircase-like profile that approximates a tapered edge. While any appropriate number of successive etching and ashing (or other mask reduction or shrinkage) steps can be used, in one embodiment, three such iterations provide an acceptable approximation of a tapered edge.

This iterative etching and ashing (or other mask reduction or shrinkage) process can also be applied to the etching of a mirror layer. On one embodiment, the mirror layer is masked, and a first etch, which may be a $H_3PO_4$ etch, is used to etch a portion of the exposed mirror layer. The mask is then partially ashed, exposing a previously unetched portion of the mirror layer, and the mirror layer is then etched via a second etch, which in certain embodiments may be the same as the first etch, and in other embodiments may be a different etch, such as a TMAH etch, which may be more selective with respect to the underlying sacrificial or etch stop layer.

Figure 17A:
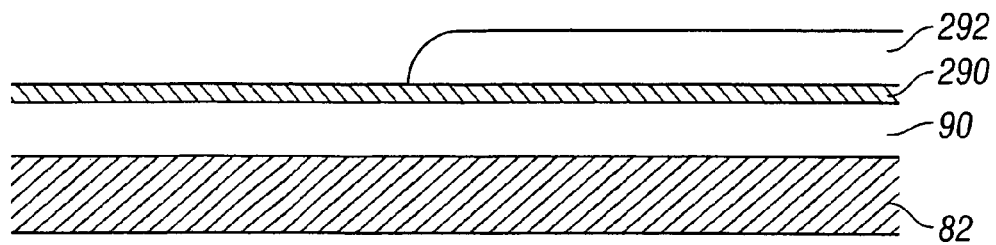
FIGS. 17A-17E are schematic cross-sections illustrating a method for forming a MEMS structure having a tapered edge though the use of multiple etches.

In another embodiment, an alternate iterative etching process may be used to form a patterned mirror layer having a tapered edge. In FIG. 17A, it can be seen that a reflective layer 90 has been deposited over the first sacrificial layer 82, and that an etch leading layer 290 has been deposited over the reflective layer 90, followed by a photoresist mask 292. In the illustrated embodiment, the etch leading layer 290 is etchable by an etch (e.g., fluorine-containing) which will also etch the sacrificial layer 82, and in particular may comprise the same material as the sacrificial layer, e.g., molybdenum.

Figure 17B:
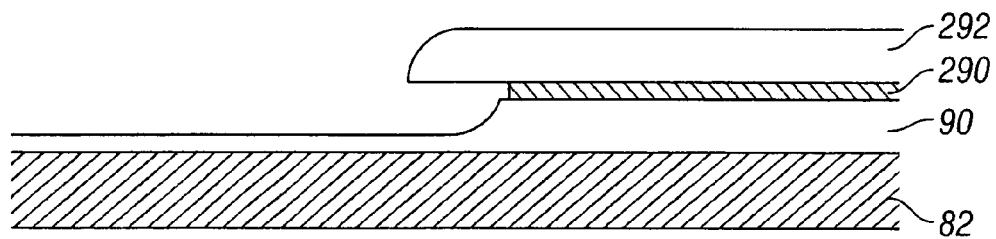
Figure 17C:
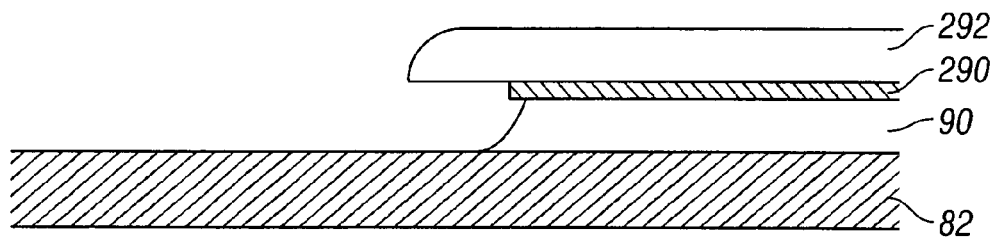

In FIG. 17B, the reflective layer 90 has been partially etched, such as through the use of a PAN etch, which will etch both aluminum and molybdenum, although it can be seen that the underlying sacrificial layer 82 has not been exposed by this etch. In FIG. 17C, the remainder of the exposed reflective layer 90 has been etched using an etch which is selective with respect to the sacrificial material, such as an $H_3PO_4$ etch. By not exposing the underlying sacrificial material to an etch which will significantly etch the sacrificial material, undercut of the reflective layer 90 can be avoided, and the desired tapered shape obtained.

Figure 17D:
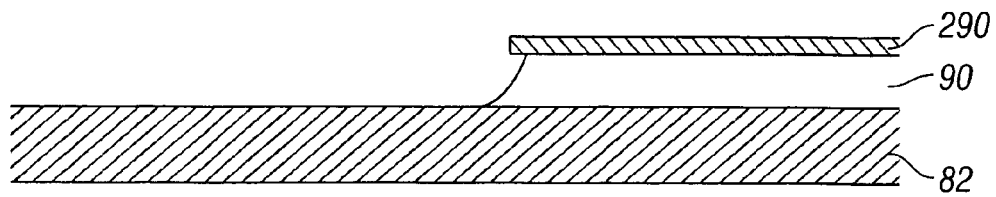
Figure 17E:
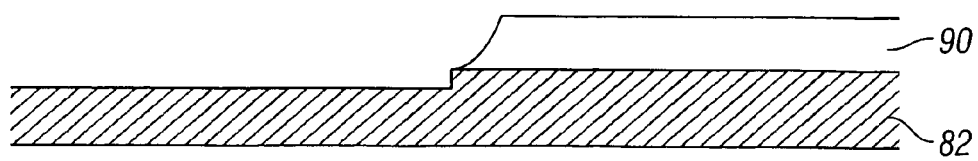

In FIG. 17D, the mask 292 is been stripped. In FIG. 17E, the etch leading layer 290 has been removed by an etch which is selective with respect to the reflective layer 90, such as an $SF_6/O_2$ etch. Although a portion of the underlying sacrificial material 92 may be removed by this etch, it will not have an effect on the tapered shape of the patterned reflective layer 90, as the etch is selective with respect to the reflective layer 90, and will not etch the reflective layer 90 from beneath.

It will be understood that although the above methods for forming a tapered edge have been discussed primarily with respect to shaping the edges of posts, these methods may be modified and applied to forming tapered edges of other layers in the disclosed MEMS devices, such as an electrode layer or a sacrificial layer, particularly when opening tapered apertures in support regions. In addition, the processes disclosed and described herein may be modified to incorporate these steps whenever the processes could benefit from the etching of a layer such that it comprises tapered edges. These processes may also be utilized in conjunction with other methods of forming MEMS devices, such as the disclosed interferometric modulators.

In conjunction with, or in place of, the forming of tapered edges on layers, the deposition of overlying layers can also be facilitated by several alternate methods of improving step coverage at edges of layers. In certain embodiments, the sputter deposition may be biased, so that some or all of the material being deposited is deposited at an angle, so as to provide better coverage at corners, reducing the need for tapering the steps. In another embodiment, the substrate on which these layers are being deposited may be tilted at an angle to the target structure, and in further embodiments may be rotated during deposition. In another embodiment, the profile of the target structure used in sputter deposition may be optimized so that certain portions are at desired angles to the substrate onto which the material sputtered. In yet another embodiment, substrate on which the layer is being deposited is rocked back and forth.

Sputter etching may also be advantageously be utilized in the processes described herein. In addition to roughening and cleaning a surface on which another layer is to be deposited, as discussed above, sputter etching may be used in conjunction with the sputter deposition. In one embodiment, a thicker layer than necessary is deposited, and then sputter etched to the desired thickness, providing a smoother layer (e.g., by rounding corners). In a further embodiment, sputter etching and deposition can be alternated. A biased sputter may also be used to improve step coverage on conductive substrates, conductive layers, or substrates on conductive supports (e.g., chucks). Other deposition processes may also be used, such as atomic layer deposition (ALD) atmospheric pressure chemical vapor deposition (AP-CVD), low pressure chemical vapor deposition (LP-CVP), high-density plasma chemical vapor deposition (HDP-CVD), and in further embodiments these deposition processes may be modified to include biasing. Any of these methods may be used in conjunction with any of the processes described herein to improve step coverage. Furthermore, in certain embodiments, the use of these methods may reduce or eliminate the need to form tapered edges on layers, or augment the advantages of tapered edges.

Figure 18A:
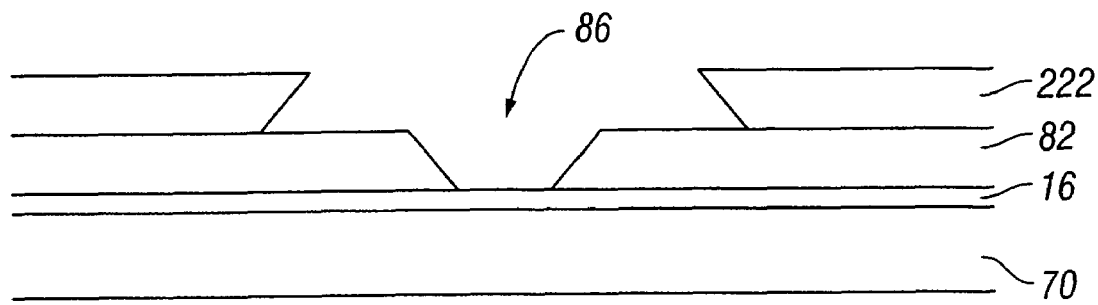
FIGS. 18A-18C are schematic cross-sections illustrating a method for forming a support structure having tapered edges through the use of a liftoff process.

In other embodiments, lift-off processes can be utilized to form the desired layers during fabrication of the interferometric modulator. In one embodiment, described with respect to FIGS. 18A-18C, a lift-off process can be utilized to form a desired support structure adjacent a movable layer, and in particular a support post structure underlying the movable layer. Advantageously, this lift-off process permits the deposition of layers, such as inorganic posts, having the desired taper, facilitating the deposition of overlying layers. In addition, this process may eliminate the need to selectively etch the post material relative to the underlying material. In FIG. 18A, it can be seen that a layer 82 of sacrificial material has been patterned and etched to form tapered apertures 86, and that a mask 222 having a negative angle at the edge is deposited over the sacrificial layer 82, such that the mask 222 does not extend to the edge of the aperture 86. In certain embodiments, this mask 222 comprises photoresist material (and in a particular embodiment may be a bilayer photoresist, to facilitate formation of the negative angle), but may also be a hard mask. In a particular embodiment, the mask 222 may comprise the photoresist used to pattern the sacrificial layer 82.

Figure 18B:
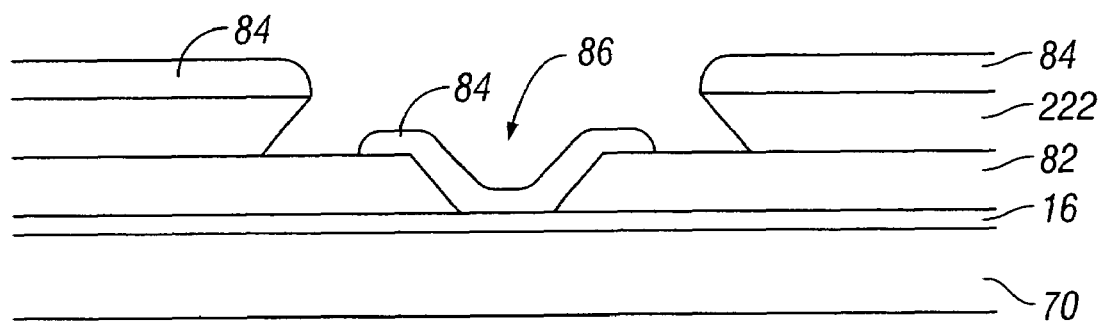

In FIG. 18B, it can be seen that a layer of post material 84 is deposited over the mask 222. The negative angle of the mask 222 results in the deposition of post material 84 in the shape of the desired inorganic post 188, having the tapered edges due to shadow effects on the deposition. Depending on the thickness of the mask 222 and the degree of the negative angle, the shape of the mask 222 also advantageously results in a gap between the post material 84 above the mask 222, and the post material 84 which will form the inorganic post. In this embodiment, the mask 222 is advantageously thicker than the materials to be deposited, permitting access to the mask 222 by etchant or ashing chemicals. Preferably, the post material is deposited via physical vapor deposition (e.g., an evaporation or sputtering process), so as to avoid deposition of material on the underside of the mask 222 which would inhibit the liftoff of the undesired portion of material overlying the mask 222. However, if such connections are formed, for example if a CVD process is used to deposit the post layer 84, ultrasonic energy can be used to break any connecting portions, as they will likely be thin in the shadowed region under the mask overhang relative to the thickness of the post layer 84 generally.

Figure 18C:
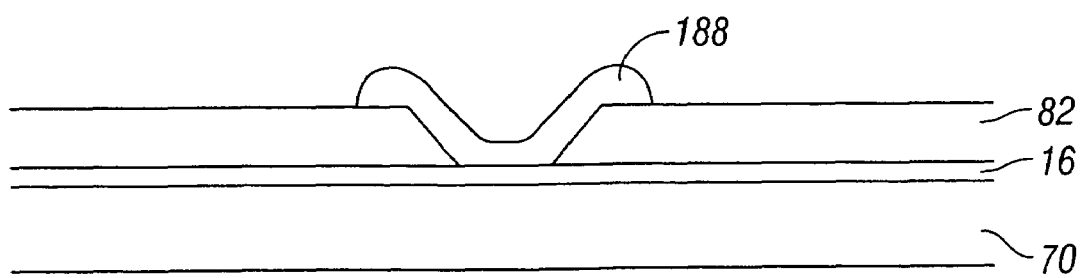

In FIG. 18C, it can be seen that a liftoff process is used to remove the mask 222, removing the post material 84 overlying the mask 222 at the same time. This liftoff process may comprise an etch to remove the mask 222, such as a wet etch, or a gaseous or vaporous etch. The liftoff process may also comprise a wrinkle bake and rinsing process to remove those materials which are no longer attached. The fabrication process further comprises the subsequent deposition of a movable layer, patterning, and releasing the MEMS device, as discussed above.

A similar liftoff process may also be utilized to form rivet structures overlying a movable layer. In particular, the process of FIGS. 18A-18C may be modified by depositing a movable layer (such as the movable layer 66) over the patterned sacrificial layer prior to depositing the mask. A layer of the desired rivet material is then deposited over the mask, and the mask is then removed, lifting off the excess rivet layer, forming a rivet. Advantageously, as discussed above, this may eliminate the need to selectively etch the rivet layer relative to an underlying mechanical layer. Thus, a rivet may be formed from the same material as the mechanical layer without the need for an etch barrier layer between the two layers.

Figure 19A:
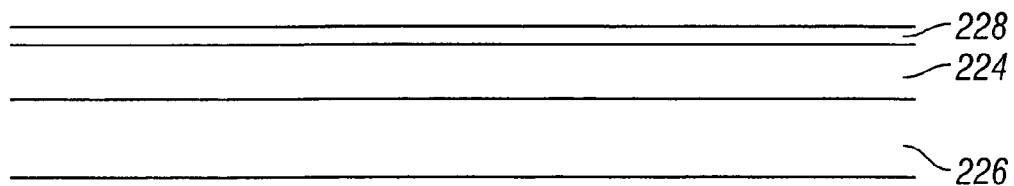
FIGS. 19A-19C are schematic cross-sections illustrating a method for forming a mask layer having a negative taper for use in a liftoff process.
Figure 19B:
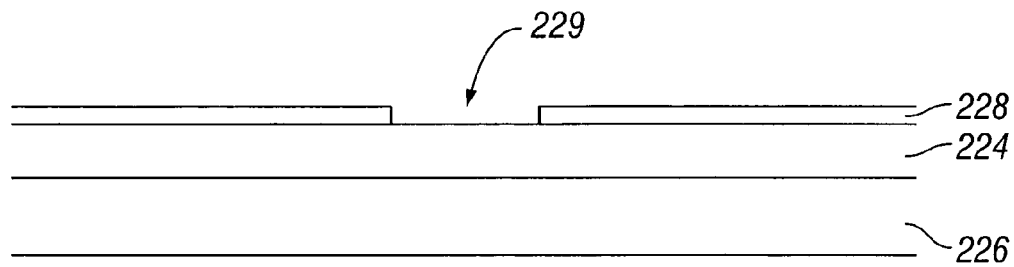
Figure 19C:
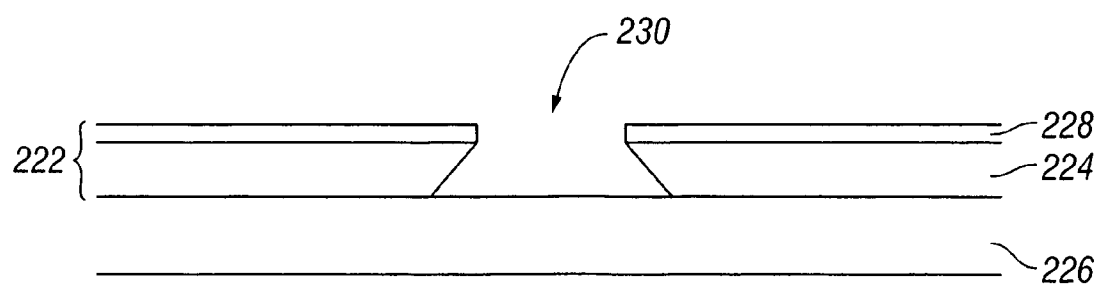
Figure 20:
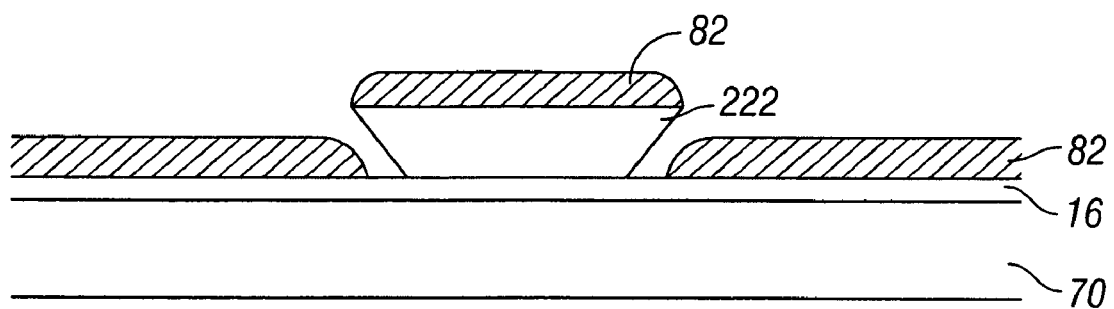
FIG. 20 is a schematic cross-section illustrating a step in a method for forming a sacrificial layer having a tapered aperture.

In one embodiment, the mask 222 having a negative angle can be formed through the use of a photoresist mask in conjunction with an underlying layer of liftoff material. FIGS. 19A-19C depict a process for forming such a mask. In FIG. 19A, it can be seen that a layer of liftoff material 224 has been deposited over an underlying layer 226 (which may be, for example a sacrificial layer), and a layer of photoresist material 228 has been deposited over the liftoff layer 224. In FIG. 19B, the photoresist material 228 has been patterned and selectively removed to form an aperture 229, which will permit etching of the underlying liftoff layer 224.

In FIG. 19C, it can be seen that the liftoff layer 224 has been selectively etched with some degree of isotropy to laterally recess under the photoresist 228 and to form a cavity 230, with edges having a negative angle or overhang, as discussed above. This negative angle can be achieved, for example, by selectively overetching the liftoff layer 224. In one embodiment, the liftoff layer 224 comprises a polyimide release layer. In one embodiment, the liftoff layer 224 may itself be photopatternable. In one embodiment, the liftoff layer 224 may be bilayer photoresist with undercut formed by development. In one embodiment, as previously depicted in FIG. 18) the mask 222 may be formed from a single liftoff layer, rather than from a liftoff layer in conjunction with a photoresist mask.

A liftoff process may be utilized to form other desired shapes during the fabrication of supports for a MEMS device, such as the illustrated interferometric modulator. In another embodiment, described with respect to FIG. 20, a liftoff process is utilized to form tapered apertures in the sacrificial layer 82. In this embodiment, a mask 222 is first formed over the optical stack 16, prior to deposition of the sacrificial layer 82. As can be seen, this mask 222 comprises negative angles which control the shape of the deposited sacrificial layer 82. Still with respect to FIG. 20, it can be seen that a layer 82 of sacrificial material has been deposited, such that the sacrificial material located on the substrate will have a shape with the desired tapered apertures upon liftoff of the mask 222 and the overlying sacrificial material.

Figure 21:
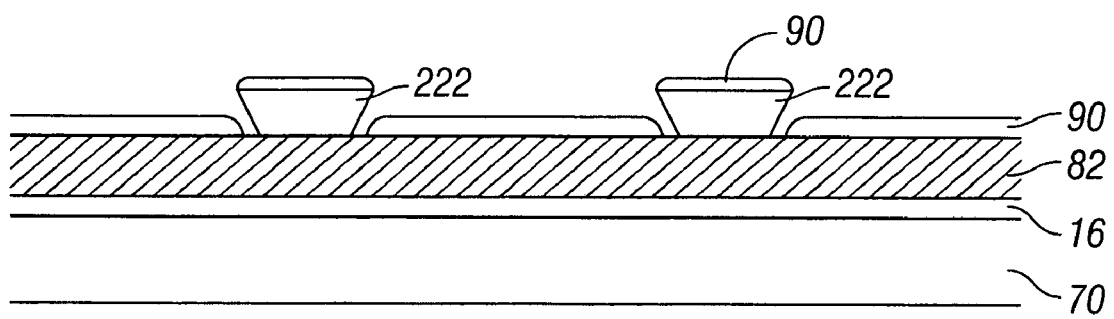
FIG. 21 is a schematic cross-section illustrating a step in a method for forming an isolated electrode member having a tapered edge.

In another embodiment, described with respect to FIG. 21, a liftoff process is used to form isolated electrode members, which in an embodiment comprising an optical MEMS may be mirrors. This embodiment includes the steps of FIG. 9A-9D. In FIG. 21, it can be seen that a mask 222 is deposited over the sacrificial layer 82, the mask layer having 222 a re-entrant profile along the side of the mask layer 222, and that a layer of reflective material 90 is then deposited over the mask layer 222. In a later step, the mask 222 is removed by a liftoff process, along with the overlying portions of the reflective layer 90, forming isolated electrode members, which in this embodiment comprise mirrors. The fabrication process may continue as discussed with respect to FIGS. 10C-10F.

It will be understood that various combinations of the above embodiments are possible. Various other combinations of the methods discussed above are contemplated and are within the scope of the invention. In addition, it will be understood that structures formed by any of the methods above may be utilized in combination with other methods of forming structures within MEMS devices.

It will also be recognized that the order of layers and the materials forming those layers in the above embodiments are merely exemplary. Moreover, in some embodiments, other layers, not shown, may be deposited and processed to form portions of an MEMS device or to form other structures on the substrate. In other embodiments, these layers may be formed using alternative deposition, patterning, and etching materials and processes, may be deposited in a different order, or composed of different materials, as would be known to one of skill in the art.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

While the above detailed description has shown, described, and pointed out novel features of the invention as applied to various embodiments, it will be understood that various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

We claim:

1. A method of fabricating a MEMS device, comprising:
   forming a sacrificial layer over a substrate;
   patterning the sacrificial layer to form apertures;
   forming a support layer over the patterned sacrificial layer;
   forming a mask over the support layer;
   patterning the support layer using the mask to form at least one support structure located at least partially within the aperture in the sacrificial layer; and
   tapering the support structure to form a tapered edge, wherein at least a portion of the mask remains in place during the tapering.

2. The method of claim 1, wherein patterning the support layer and tapering the support structure comprise a single etching process, and wherein the mask remains in place during the etching process.

3. The method of claim 1, additionally comprising forming an etch leading layer over the support layer, wherein the etch leading layer is formed between the mask and the support layer.

4. The method of claim 3, wherein tapering the support structure comprises using an etch which etches the etch leading layer at a greater rate than the support structure.

5. The method of claim 3, wherein tapering the support structure comprises:
   etching a portion of the etch leading layer using a first etch which does not significantly etch the support structure; and
   subsequently etching the support layer to form the at least support structure.

6. The method of claim 1, wherein forming the support layer comprises forming a support layer having varying properties over the thickness of the layer.

7. The method of claim 6, wherein forming the support layer having varying properties over the thickness of the layer comprises varying process conditions during deposition of the support layer.

8. The method of claim 6, wherein forming the support layer having varying properties over the thickness of the support layer comprises:
   depositing a first sublayer over the sacrificial layer; and
   depositing at least a second sublayer over the first sublayer, wherein the second sublayer is etchable by an etchant used during the tapering at a greater rate than the first sublayer.

9. The method of claim 1, wherein forming a mask over the support layer comprises depositing a mask having poor adhesion to the support layer.

10. The method of claim 1, wherein tapering the support structure comprises:
    etching an exposed portion of the support layer;
    removing a portion of the mask, exposing an additional portion of the support structure; and
    etching the exposed portion and the additional portion exposed by removal of a portion of the mask.

11. The method of claim 10, wherein removing a portion of the mask comprises partially ashing the mask.

12. The method of claim 10, additionally comprising forming an etch stop layer between the sacrificial layer and the support layer.

13. The method of claim 1, additionally comprising forming a movable layer adjacent the at least one support structure.

14. The method of claim 13, wherein the movable layer is formed after deposition of the layer of support material and is formed over the at least one support structure.

15. The method of claim 13, wherein forming the movable layer comprises:
    forming a reflective sublayer over the sacrificial layer; and
    forming a mechanical sublayer over the reflective sublayer.

16. The method of claim 1, additionally comprising performing a release etch to remove the sacrificial layer, forming an air gap located between the movable layer and the substrate.

17. The method of claim 1, additionally comprising forming a lower electrode layer over the substrate prior to deposition of the sacrificial layer, wherein the sacrificial layer is formed over the lower electrode layer.

18. The method of claim 1, wherein the MEMS device is an interferometric modulator.

19. A MEMS device formed by the method of claim 1.

* * * * *

UNITED STATES PATENT AND TRADEMARK OFFICE
CERTIFICATE OF CORRECTION

PATENT NO.       : 7,660,058 B2                                        Page 1 of 1
APPLICATION NO. : 11/506770
DATED            : February 9, 2010
INVENTOR(S)      : Qiu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 700 days.

Signed and Sealed this

Twenty-eighth Day of December, 2010

David J. Kappos
*Director of the United States Patent and Trademark Office*